United States Patent
Suzuki

(10) Patent No.: US 10,372,576 B2
(45) Date of Patent: Aug. 6, 2019

(54) SIMULATION REPRODUCTION APPARATUS, SIMULATION REPRODUCTION METHOD, AND COMPUTER READABLE MEDIUM

(71) Applicant: Mitsubishi Electric Corporation, Tokyo (JP)

(72) Inventor: Hirokazu Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/559,776

(22) PCT Filed: May 11, 2015

(86) PCT No.: PCT/JP2015/063470
§ 371 (c)(1),
(2) Date: Sep. 19, 2017

(87) PCT Pub. No.: WO2016/181455
PCT Pub. Date: Nov. 17, 2016

(65) Prior Publication Data
US 2018/0067832 A1    Mar. 8, 2018

(51) Int. Cl.
*G06F 9/44*    (2018.01)
*G06F 11/28*    (2006.01)
(Continued)

(52) U.S. Cl.
CPC .......... *G06F 11/28* (2013.01); *G06F 11/3461* (2013.01); *G06F 11/3612* (2013.01);
(Continued)

(58) Field of Classification Search
CPC ............. G06F 17/5022; G06F 17/5045; G06F 17/5081; G06F 17/5009; G06F 17/5036; G06F 2217/84
(Continued)

(56) References Cited

U.S. PATENT DOCUMENTS 5,566,300 A    10/1996    Naoe
7,130,783 B1 *    10/2006    Harer ................... G06F 11/261
                                                703/13
(Continued)

FOREIGN PATENT DOCUMENTS

JP    07-271629 A    10/1995
JP    10-011118 A    1/1998
(Continued)

OTHER PUBLICATIONS

Ben Zarlingo, "Analyze Agile or Elusive Signals Using Real-Time Measurement and Triggering", Agilent Technologies Inc 2013 (Year: 2013).*

(Continued)

*Primary Examiner* — Andre Pierre Louis
(74) *Attorney, Agent, or Firm* — Birch, Stewart, Kolasch & Birch, LLP

(57) ABSTRACT

A storage unit stores a trace file obtained by simulating an operation of an object. A reception unit receives a forward direction reproduction instruction. A reproduction unit reads each piece of trace data from the trace file. The reproduction unit determines a timing for updating a graphic display, based on a new display time corresponding to an occurrence time included in new trace data read this time and an old display time corresponding to an occurrence time included in old trace data read last time. A display unit changes a state of the object displayed by the graphic display to a state indicated by a new state value included in the new trace data, at the determined timing.

15 Claims, 21 Drawing Sheets

(51) Int. Cl.
*G06F 11/36* (2006.01)
*G06F 17/50* (2006.01)
*G06F 11/34* (2006.01)
*G06F 17/10* (2006.01)
*G05B 17/02* (2006.01)

(52) U.S. Cl.
CPC ...... *G06F 11/3636* (2013.01); *G06F 11/3648* (2013.01); *G06F 11/3664* (2013.01); *G06F 17/5009* (2013.01); *G05B 17/02* (2013.01)

(58) Field of Classification Search
USPC .................................................. 703/13, 21
See application file for complete search history.

(56) References Cited

U.S. PATENT DOCUMENTS

| | | | |
|---|---|---|---|
| 7,617,420 | B2 | 11/2009 | Kimura |
| 8,296,111 | B2 | 10/2012 | Moriyama |
| 2005/0289400 | A1 | 12/2005 | Kimura |
| 2009/0103902 | A1 | 4/2009 | Matsuura et al. |
| 2010/0100365 | A1 | 4/2010 | Moriyama |
| 2010/0180245 | A1* | 7/2010 | Rutten .................. G06F 11/323 716/113 |
| 2013/0055026 | A1 | 2/2013 | Hatano et al. |

FOREIGN PATENT DOCUMENTS

| | | | |
|---|---|---|---|
| JP | 10-333938 | A | 12/1998 |
| JP | 2000-268005 | A | 9/2000 |
| JP | 2005-234617 | A | 9/2005 |
| JP | 2006-012066 | A | 1/2006 |
| JP | 2007-79756 | A | 3/2007 |
| JP | 2007-334812 | A | 12/2007 |
| JP | 2010-009497 | A | 1/2010 |
| JP | 2010-097406 | A | 4/2010 |
| JP | 2013-45184 | A | 3/2013 |
| JP | 2013-161429 | A | 8/2013 |
| WO | WO 2014/118897 | A1 | 8/2014 |

OTHER PUBLICATIONS

U.S. Appl. No. 16/077,380, filed Aug. 10, 2018.
Communication pursuant to Article 94(3) EPC dated Nov. 29, 2018 in corresponding European Application No. 15 891 781.5.

* cited by examiner

Fig. 2

191:TRACE FILE

| OCCURRENCE TIME | NUMBER OF CYCLES | OBJECT IDENTIFIER | NEW STATE VALUE | OLD STATE VALUE | |
|---|---|---|---|---|---|
| 00000a00 | 00000100 | P_0_7 | 1 | 0 | ← 191D |
| 00000ba4 | 0000012a | IN3 | 0 | 1 | |
| 00000cee | 0000014b | LED1 | 1 | 0 | |
| 00000da2 | 0000015d | DR3 | 1f | 1e | |

Fig. 4
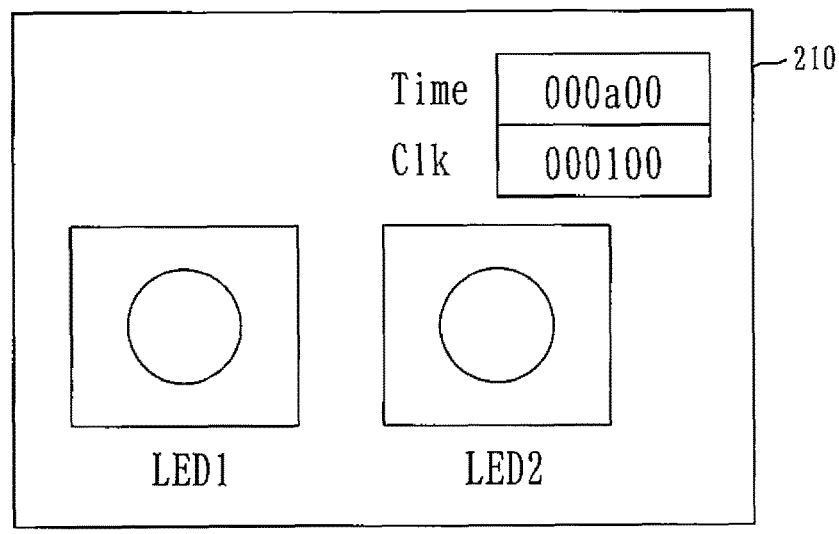
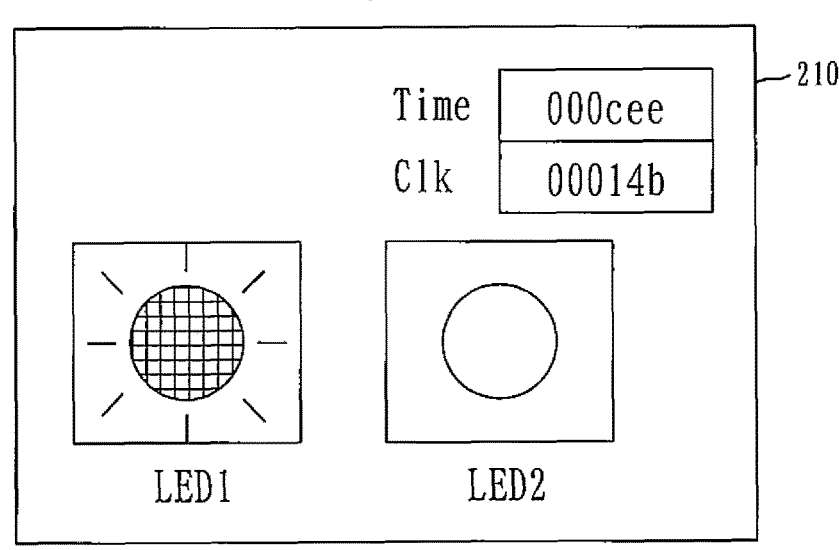
Fig. 5
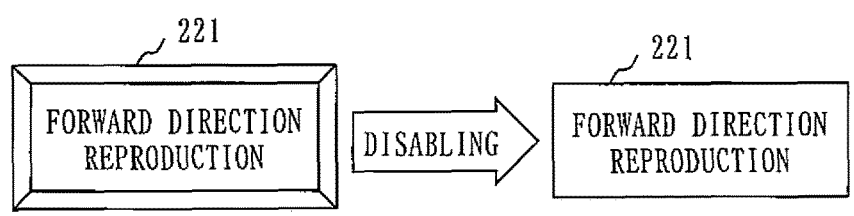

Fig. 21

191: TRACE FILE

| OCCURRENCE TIME | NUMBER OF CYCLES | OBJECT IDENTIFIER | NEW STATE VALUE | OLD STATE VALUE | DELAY PERIOD |
|---|---|---|---|---|---|
| 00000a00 | 00000100 | P_0_7 | 1 | 0 | 10 |
| 00000ba4 | 0000012a | IN3 | 0 | 1 | 20 |
| 00000cee | 0000014b | LED1 | 1 | 0 | 15 |
| 00000da2 | 0000015d | DR3 | 1f | 1e | 7 |

191D

SIMULATION REPRODUCTION APPARATUS, SIMULATION REPRODUCTION METHOD, AND COMPUTER READABLE MEDIUM

TECHNICAL FIELD

The present invention relates to a technology for reproducing, by a graphic display, an operation of an object that has been simulated.

BACKGROUND ART

In development of software for an embedded apparatus in recent years, in order to early start software debugging, a software simulator to simulate operations of a microcomputer on which the software is running and a peripheral device of the microcomputer is used. The use of this simulator allows the software debugging to be performed before a test environment for hardware on which the software is actually running is completed.

The software simulator may perform a graphic display of a state of the peripheral device or a state of the input/output terminal of the microcomputer. To take example, the software simulator performs the graphic display of turning on and off of an LED, as respective states of the peripheral device. Alternatively, the software simulator performs the graphic display of a signal value of a signal input to or output from the input/output terminal, as the state of the input/output terminal.

Thus, a user may visually recognize, by a graphic, a situation where each state of the peripheral device or the state of the input/output terminal of the microcomputer changes during execution of simulation by the software simulator.

Patent Literature 1 discloses a simulator as mentioned above. The simulator disclosed in Patent Literature 1 operates as follows.

The simulator records an occurrence time at which a change in a state has occurred during execution of simulation and an updated value being a state value after the change, as trace data.

After the simulation, the simulator converts the occurrence time of the trace data to a reproduction display time at which the state change is to be reproduced and displayed.

Then, the simulator reads the trace data and displays the state change by a graphic, at the reproduction display time.

With this arrangement, the simulator may reproduce the state change, using the trace data, without execution of simulation again.

Further, the simulator converts the occurrence time to the reproduction display time using a speed ratio of a time-lapse speed during the reproduction to a time-lapse speed during the simulation, thereby allowing change of a speed of reproducing the state change. To take an example, the simulator may reproduce the state change at high speed.

The conventional simulator, however, cannot reproduce the state change in the reverse order of lapse of time. Therefore, the conventional simulator is inconvenient in the following respects.

When a wrong operation occurs during simulation, a user desires to identify a change in a state while tracing back to the past from a point of time when he has noticed the wrong operation, in order to find the cause of the wrong operation.

The conventional simulator, however, cannot reproduce the state change in the reverse order of lapse of time. Thus, the user must find the cause of the wrong operation while identifying, from a starting point of time of the simulation, the state change in the order of lapse of time. As a result, it will take time to find the cause of the wrong operation.

Further, the conventional simulator cannot change a speed of reproducing the state change, during the course of the reproduction of the state change.

Therefore, the user may overlook the state change if the speed of the reproduction is fast, and it will take time to identify the state change if the speed of the reproduction is slow.

To take an example, when a LED blinks at high speed during reproduction, the user desires to increase a blinking time interval of the LED in order to ensure a period of visual recognition. However, since the conventional simulator cannot change the speed of reproduction during the reproduction, the blinking time interval of the LED cannot be increased. When a turn-on state of the LED during the reproduction does not change, the user desires to reduce a display continuation period of the LED whose turn-on state remains unchanged, in order to enhance efficiency of the recognition work. However, since the conventional simulator cannot change the speed of reproduction during the reproduction, the display continuation period of the LED whose turn-on state remains unchanged cannot be reduced.

CITATION LIST

Patent Literature

Patent Literature 1: JP 2007-334812A

SUMMARY OF INVENTION

Technical Problem

An object of the present invention is to allow a display continuation period of an object whose state remains unchanged to be within an upper limit period, when an operation of the object that has been simulated is reproduced by a graphic display.

Solution to Problem

A simulation reproduction apparatus of the present invention reproduces, by a graphic display, an operation of an object that has been simulated.

The simulation reproduction apparatus may include:

a storage unit to store a trace file obtained by simulating the operation of the object and having one or more pieces of trace data recorded therein, each piece of the trace data including an occurrence time at which a change in a state of the object has occurred and a new state value indicating a state after the state has changed;

a reception unit to receive an upper limit period being an upper limit of a length of a display continuation period of the object whose state remains unchanged;

a trace data reading unit to read each piece of the trace data from the trace file; and a display unit to change the state of the object displayed by the graphic display to the state indicated by the new state value included in new trace data at a time shifted from an old display time by the upper limit period when an interval between a new display time and the old display time is longer than the upper limit period, the new display time corresponding to the occurrence time included in the new trace data being the trance data read at a time and the old display time corresponding to the occurrence time included in old trace data being the trace data read at a previous time.

Advantageous Effects of Invention

According to the present invention, when the operation of the object that has been simulated is reproduced by the graphic display, the display continuation period of the object whose state remains unchanged may be made to be within the upper limit period.

BRIEF DESCRIPTION OF DRAWINGS

FIG. 2 is a configuration diagram of a trace file 191 in the first embodiment.

FIG. 4 is a diagram illustrating a change in a graphic display 210 in the first embodiment.

FIG. 5 is a diagram illustrating disabling of a forward direction reproduction button 221 in the first embodiment.

FIG. 21 is a configuration diagram of a trace file 191 in a second embodiment.

DESCRIPTION OF EMBODIMENTS

First Embodiment

Based on FIGS. 1 to 20, a description will be given about a simulation reproduction apparatus 100 to reproduce, by a graphic display, an operation of an object that has been simulated.

\*\*\*Description of Configuration\*\*\*

Figure 1:
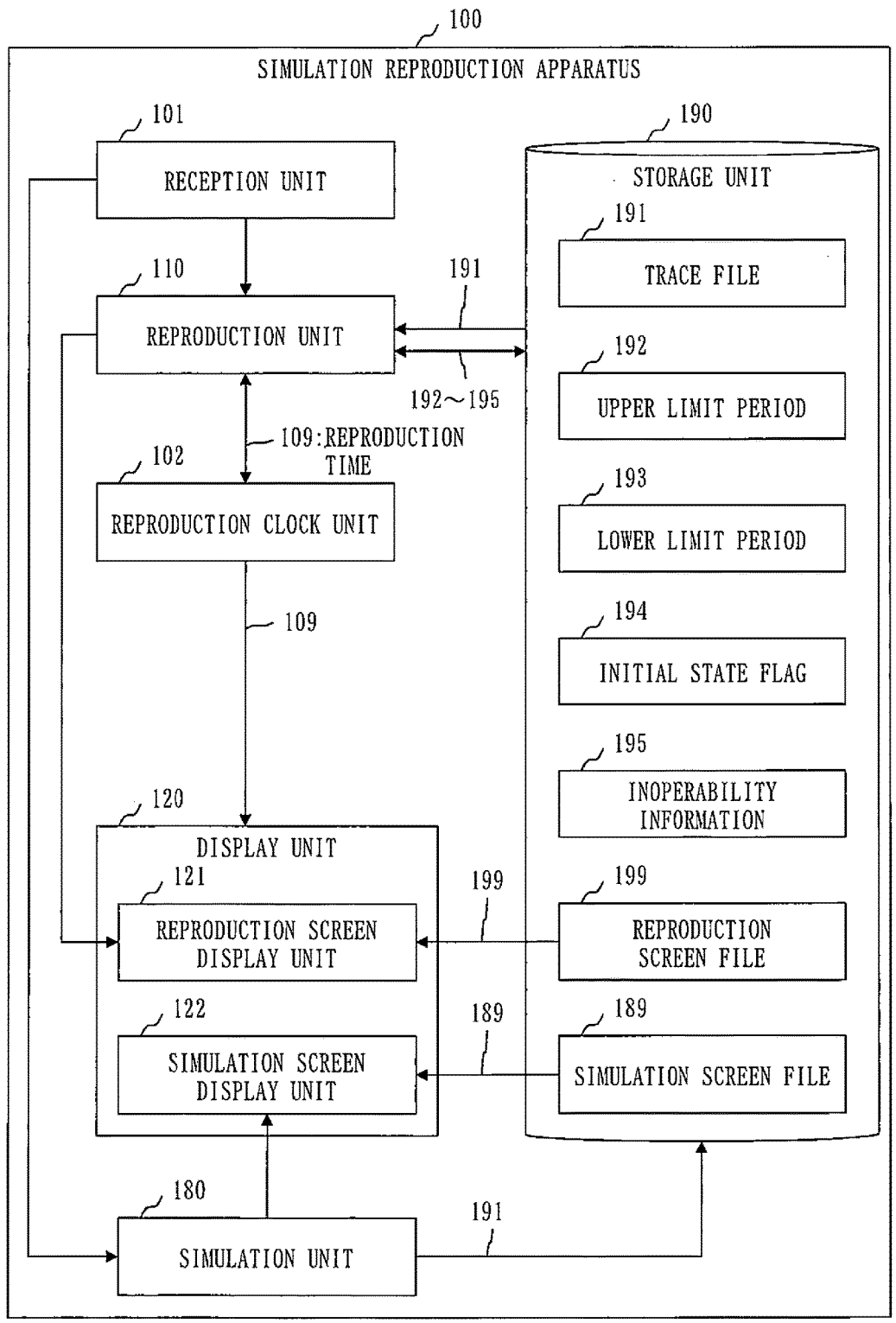
FIG. 1 is a functional configuration diagram of a simulation reproduction apparatus 100 in a first embodiment.

The simulation reproduction apparatus 100 will be described, based on FIG. 1.

The simulation reproduction apparatus 100 includes a reception unit 101, a reproduction unit 110, a reproduction clock unit 102, a display unit 120, a simulation unit 180, and a storage unit 190.

The reception unit 101 receives a user instruction that is input to the simulation reproduction apparatus 100 by a user who uses the simulation reproduction apparatus 100.

The user instruction includes a simulation instruction and a reproduction instruction.

The simulation instruction is an instruction to cause the operation of the object to be simulated.

The reproduction instruction is an instruction to cause the operation of the object that has been simulated to be reproduced by the graphic display.

The reproduction instruction includes a reproduction start instruction, a forward direction reproduction instruction, a reverse direction reproduction instruction, a temporary stop instruction, a forward direction frame feed instruction, a reverse direction frame feed instruction, and a parameter setting instruction.

The reproduction start instruction is an instruction to cause the reproduction of the operation of the object to be started.

The forward direction reproduction instruction is an instruction to cause forward direction reproduction of the operation of the object to be performed in the order of times.

The reverse direction reproduction instruction is an instruction to cause reverse direction reproduction of the operation of the object to be performed in the reverse order of the times.

The temporary stop instruction is an instruction to cause the reproduction of the operation of the object to be temporarily stopped.

The forward direction frame feed instruction is an instruction to cause forward direction frame feeding to be performed. In the forward direction frame feeding, a state of the object changes once in the order of the times The reverse direction frame feed instruction is an instruction to cause reverse direction frame feeding to be performed. In the reverse direction frame feeding, a state of the object changes once in the reverse order of the times.

The parameter setting instruction is an instruction to cause a parameter to be used at a time of the reproduction of the operation of the object to be set.

The parameter setting instruction includes an upper limit period setting instruction and a lower limit period setting instruction.

The upper limit period setting instruction is an instruction to cause an upper limit period 192 to be set, and the lower limit period setting instruction is an instruction to cause a lower limit period 193 to be set.

The upper limit period 192 is an upper limit of a length of a display continuation period of the object whose state remains unchanged. The initial value of the upper limit period 192 is a value indicating a longest period.

The lower limit period 193 is a lower limit of the length of the display continuation period of the object whose state remains unchanged. The initial value of the lower limit period 193 is a value indicating a shortest period.

When the simulation instruction is received, the simulation unit 180 simulates the operation of the object by execution of a simulation program and generates a trace file 191.

While the operation of the object is simulated, the operation of the object simulated is displayed on a simulation screen by the graphic display. The simulation screen is generated by a simulation screen display unit 122 of the display unit 120.

A configuration of the trace file 191 will be described, based on FIG. 2.

The trace file 191 is a file in which one or more pieces of trace data 191D are recorded. One row in the drawing corresponds to one piece of trace data 191D.

Each piece of trace data 191D includes an occurrence time, the number of cycles, an object identifier, a new state value, and an old state value.

The occurrence time is a time at which a change in a state of an object has occurred.

The number of cycles is a value in which the occurrence time is indicated by the number of counts of a virtual clock. The virtual clock is a clock of a virtual computer, and the virtual computer is a virtual computer in which the object operates.

The occurrence time and the number of cycles have the following relationship. A virtual clock period is the period of the virtual clock.

number of cycles=occurrence time/virtual clock period

When the number of cycles is 12A nanoseconds in hexadecimal notation and the virtual clock period is A nanoseconds in the hexadecimal notation, for example, the occurrence time is BA4 nanoseconds (=12A×A)

The object identifier is to identify the object. An example of the object is each of an LED and a peripheral device.

The new state value indicates a state of the object after the state of the object has changed.

The old state value indicates the state of the object before the state of the object changes.

The one or more pieces of trace data 191D are recorded in the trace file 191 in the order of the occurrence times.

The description will be continued by returning to FIG. 1.

When the reproduction instruction is received, the reproduction unit 110 reproduces the operation of the object by the graphic display, using the trace file 191, the reproduction time 109, the upper limit period 192, the lower limit period 193, an initial state flag 194, and inoperability information 195.

The reproduction time 109 is a time at which a time in a time zone when the operation of the object has been simulated is reproduced, and is acquired from the reproduction clock unit 102.

The initial state flag 194 is a flag indicating whether or not the state of the object that has been reproduced is an initial state. A flag value indicating the initial state is referred to as an initial state value, while a flag value indicating a state other than the initial state is referred to as a non-initial state value.

The inoperability information 195 is information indicating whether the operation of the object can be reproduced in the order of the times or in the reverse order of the times.

The reproduction clock unit 102 functions as a clock indicating a reproduction time 109. The reproduction time 109 is acquired from each of the reproduction unit 110, the display unit 120, and the simulation unit 180 at any time.

When the forward direction reproduction instruction is received, the reproduction clock unit 102 causes the reproduction time 109 to proceed in the order of the times.

When the reverse direction reproduction instruction is received, the reproduction clock unit 102 causes the reproduction time 109 to proceed in the reverse order of the times.

The display unit 120 includes a reproduction screen display unit 121 and a simulation screen display unit 122.

The reproduction screen display unit 121 displays a reproduction screen 200 using a reproduction screen file 199 and the reproduction time 109.

The reproduction screen file 199 is a file including an image constituting the reproduction screen 200.

Figure 3:
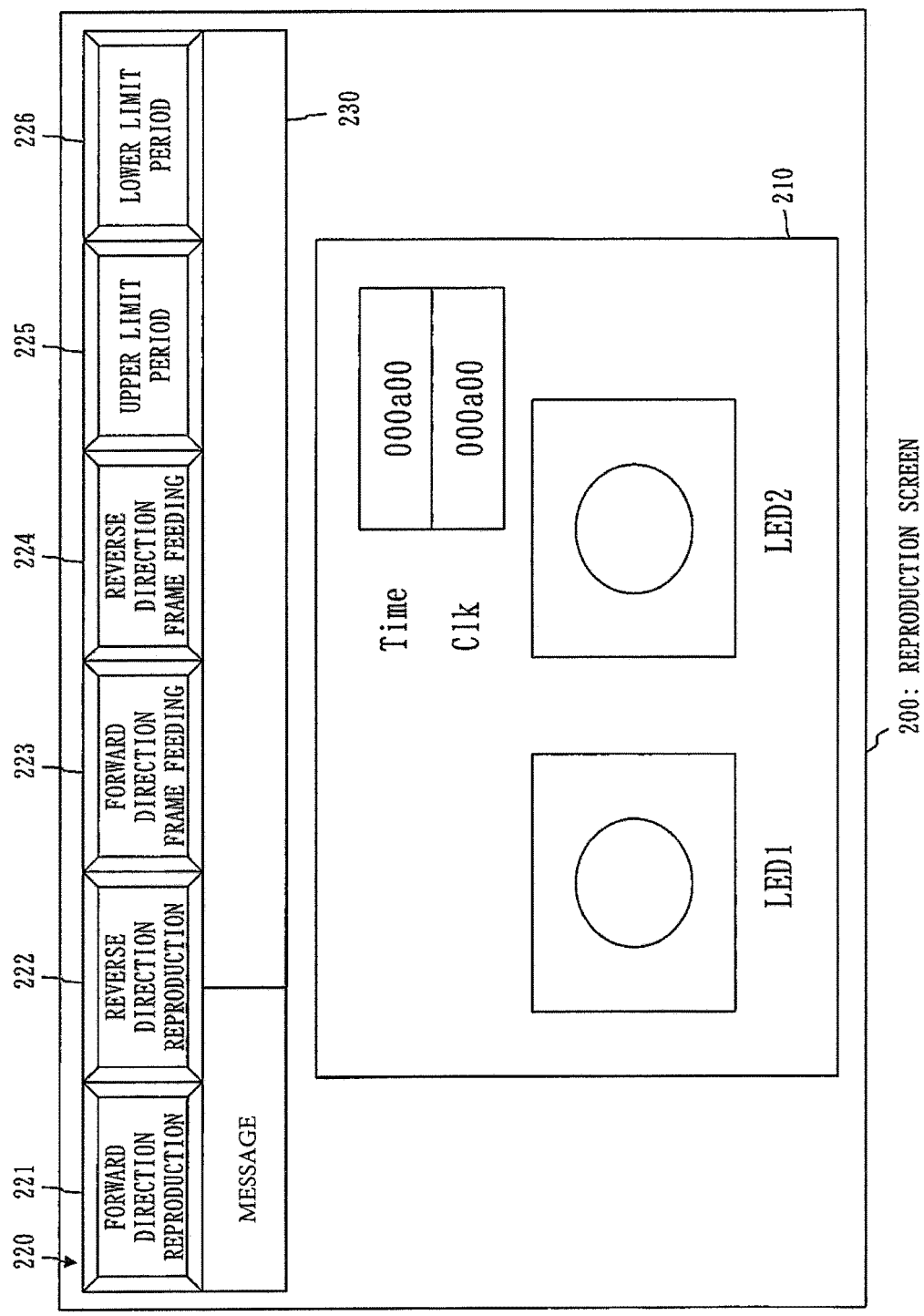
FIG. 3 is a configuration diagram of a reproduction screen 200 in the first embodiment.

The reproduction screen 200 will be described, based on FIG. 3.

The reproduction screen 200 includes a graphic display 210, a button widget 220, and a message region 230.

The graphic display 210 is a graphic indicating the change in the state of the object that has been simulated.

To take an example, with each of a LED 1 and a LED 2 set as the object, the graphic display 210 indicates respective turn-on states of the LED 1 and the LED 2. The graphic display 210 also indicates the reproduction time 109 and the number of clocks corresponding to the reproduction time 109. The reproduction time 109 is given in a Time field in the drawing, and the number of clocks is given in a Clk field in the drawing. The reproduction time 109 in the Time field and the number of clocks in the Clk field change with the reproduction time 109 of the reproduction clock unit 102.

To take an example, when only the LED1 is turned on in a state where the LED1 and the LED2 are turned off, the state of the LED1 changes from the turned-off state to the turn-on state, as illustrated in FIG. 4.

The button widget 220 includes a forward direction reproduction button 221, a reverse direction reproduction button 222, a forward direction frame feed button 223, a reverse direction frame feed button 224, an upper limit period button 225, and a lower limit period button 226.

The forward direction reproduction button 221 is a button for the forward direction reproduction. When the forward direction reproduction button 221 is depressed, the forward direction reproduction instruction is received.

The reverse direction reproduction button 222 is a button for the reverse direction reproduction. When the reverse direction reproduction button 222 is depressed, the reverse direction reproduction instruction is received.

The forward direction frame feed button 223 is a button for the forward direction frame feeding. When the forward direction frame feed button 223 is depressed, the forward direction frame feed instruction is received.

The reverse direction frame feed button 224 is a button for the reverse direction frame feeding. When the reverse direction frame feed button 224 is depressed, the reverse direction frame feed instruction is received.

The upper limit period button 225 is a button for setting the upper limit period. When the upper limit period button 225 is depressed, a dialogue for specifying the upper limit period 192 is displayed, and the instruction to set the upper limit period 192 specified in the displayed dialogue is received.

The lower limit period button 226 is a button for setting the lower limit period. When the lower limit period button 226 is depressed, a dialogue for specifying the lower limit period 193 is displayed, and the instruction to set the lower limit period 193 specified in the displayed dialogue is received.

When the inoperability information 195 indicates a reverse direction as an inoperable direction, the reverse direction reproduction button 222 and the reverse direction frame feed button 224 are disabled. When the reverse direction reproduction button 222 and the reverse direction frame feed button 224 are disabled, the reverse direction reproduction instruction and reverse direction frame feed instruction are not received, so that the reverse direction reproduction and the reverse direction frame feeding are not performed.

When the inoperability information 195 indicates a forward direction as the inoperable direction, the forward direction reproduction button 221 and the forward direction frame feed button 223 are disabled. When the forward direction reproduction button 221 and the forward direction frame feed button 223 are disabled, the forward direction reproduction instruction and forward direction frame feed instruction are not received, so that the forward direction reproduction and the forward direction frame feeding are not performed.

When the forward direction reproduction button 221 is disabled, for example, display of the forward direction reproduction button 221 is changed, as illustrated in FIG. 5. Similar display is used for the other buttons as well.

The message region 230 is a region in which a message is displayed.

When the forward direction reproduction button 221 that has been disabled is depressed, an error message to the effect that the forward direction reproduction instruction is invalid is displayed in the message region 230.

The description will be continued by returning to FIG. 1.

The simulation screen display unit 122 displays the simulation screen, using a simulation screen file 189 and the reproduction time 109.

The simulation screen file 189 is a file including an image constituting the simulation screen.

The simulation screen is a screen including a display corresponding to the graphic display 210 of the reproduction screen 200.

The storage unit 190 stores data to be used, to be generated, or to be input or output by the simulation reproduction apparatus 100.

Examples of the data to be stored in the storage unit 190 are the trace file 191, the upper limit period 192, the lower limit period 193, the initial state flag 194, the inoperability information 195, the reproduction screen file 199, and the simulation screen file 189.

Figure 6:
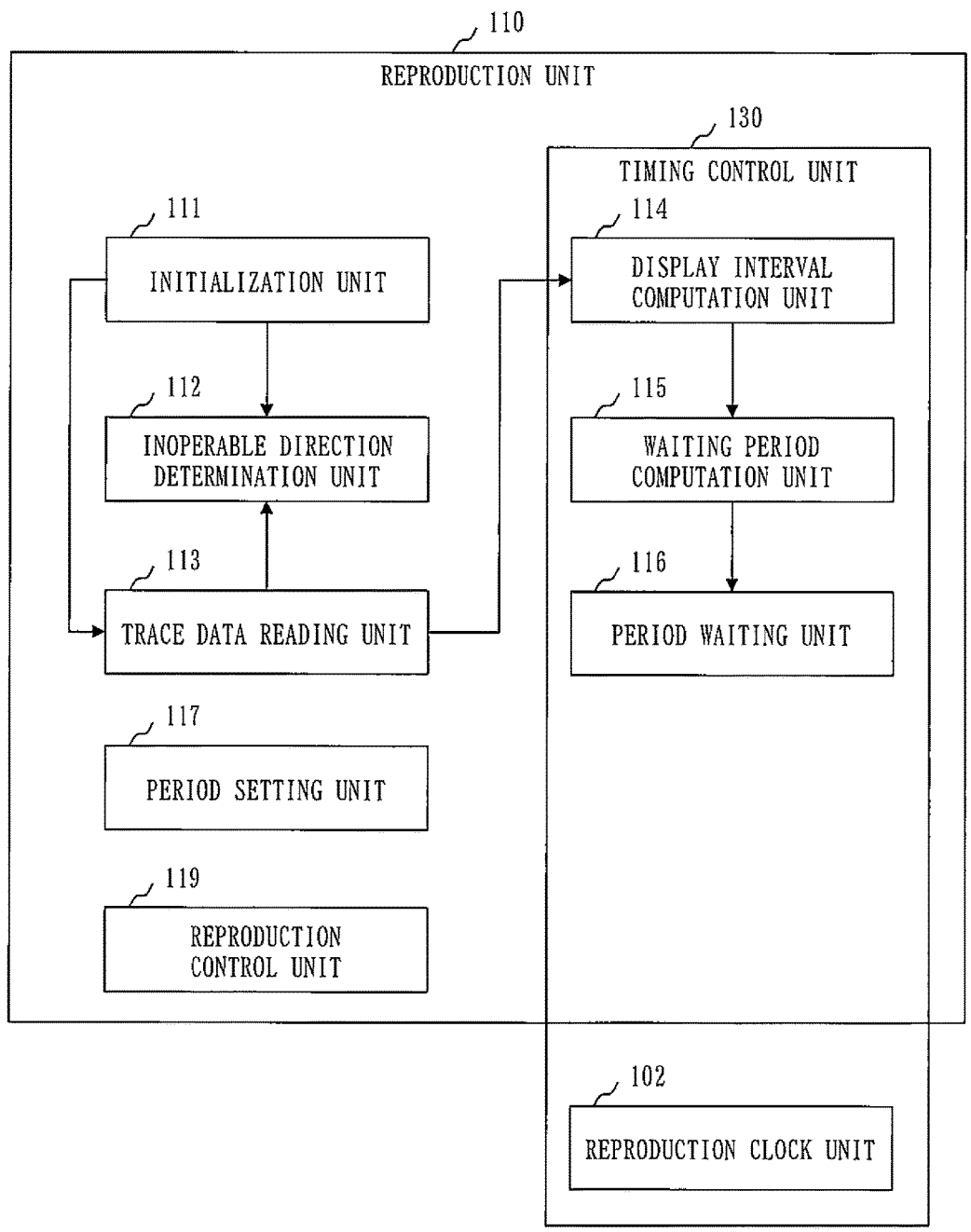
FIG. 6 is a functional configuration diagram of a reproduction unit 110 in the first embodiment.

A functional configuration of the reproduction unit 110 will be described, based on FIG. 6.

The reproduction unit 110 includes an initialization unit 111, an inoperable direction determination unit 112, a trace data reading unit 113, a display interval computation unit 114, a waiting period computation unit 115, and a period waiting unit 116. The reproduction unit 110 further includes a period setting unit 117 and a reproduction control unit 119.

The initialization unit 111 performs an initialization process for reproducing the operation of the object by the graphic display. Details of the initialization process will be described later.

The inoperable direction determination unit 112 performs an inoperable direction determination process of making determination between a valid reproduction instruction and an invalid reproduction instruction, based on a reference position in the trace file 191. Details of the inoperable direction determination process will be described later.

The trace data reading unit 113 reads the trace data 191D from the trace file 191.

When the forward direction reproduction instruction is received, the trace data reading unit 113 reads each piece of the trace data 191D in the order of the occurrence time.

When the reverse direction reproduction instruction is received, the trace data reading unit 113 reads each piece of the trace data 191D in the reverse order of the occurrence time.

When the forward direction frame feed instruction is received, the trace data reading unit 113 reads one piece of the trace data 191D in the order of the occurrence time.

When the reverse direction frame feed instruction is received, the trace data reading unit 113 reads one piece of the trace data 191D in the reverse order of the occurrence time.

The trace data read this time is referred to as new trace data.

A time corresponding to the occurrence time included in the new trace data is referred to as a new display time.

When the new trace data is read during the forward direction reproduction, the occurrence time included in the new trace data is the new display time.

When the new trace data is read during the reverse direction reproduction, a time traced back from the occurrence time included in the new trace data by a correction period is the new display time. The correction period is a minute period that has been preset.

The trace data read last time is referred to as old trace data

A time corresponding to the occurrence time included in the old trace data is referred to as an old display time.

When the old trace data is read during the forward direction reproduction, the occurrence time included in the old trace data is the old display time.

When the old trace data is read during the reverse direction reproduction, a time traced back from the occurrence time included in the old trace data by the correction period is the old display time.

The display interval computation unit 114 computes a display interval that is an interval between the new display time and the old display time.

When the forward direction reproduction instruction is received, the display interval computation unit 114 computes the interval from the old display time to the new display time, as a display interval.

When the reverse direction reproduction instruction is received, the display interval computation unit 114 computes an interval from the new display time to the old display time, as the display interval.

The waiting period computation unit 115 computes a waiting period until the state of the object is changed.

When the interval between the new display time and the old display time is longer than the upper limit period 192, the waiting period computation unit 115 computes the waiting period, using the old display time and the upper limit period 192.

When the display interval computed during the forward direction reproduction is longer than the upper limit period 192, the waiting period computation unit 115 computes an interval between the reproduction time 109 indicated by the reproduction clock unit 102 and a time at which the upper limit period 192 elapses from the old display time, as the waiting period.

When the display interval computed during the reverse direction reproduction is longer than the upper limit period 192, the waiting period computation unit 115 computes an interval between the reproduction time 109 indicated by the reproduction clock unit 102 and a time that has been traced back from the old display time by the upper limit period 192, as the waiting period.

When the interval between the new display time and the old display time is shorter than the lower limit period 193, the waiting period computation unit 115 computes the waiting period, using the old display time and the lower limit period 193.

When the display interval computed during the forward direction reproduction is shorter than the lower limit period 193, the waiting period computation unit 115 computes an interval between the reproduction time 109 indicated by the reproduction clock unit 102 and a time at which the lower limit period 193 elapses from the old display time, as the waiting period.

When the display interval computed during the reverse direction reproduction is shorter than the lower limit period 193, the waiting period computation unit 115 computes an interval between the reproduction time 109 indicated by the reproduction clock unit 102 and a time that has been traced back from the new display time by the lower limit period 193, as the waiting period.

The period waiting unit 116 waits until the computed waiting period elapses.

The period setting unit 117 sets the upper limit period 192 according to the upper limit period setting instruction, and sets the lower limit period 193 according to the lower limit period setting instruction.

The reproduction control unit 119 performs a process other than the processes to be performed by the respective functions mentioned above, among the processes to be performed by the reproduction unit 110.

The display interval computation unit 114, the waiting period computation unit 115, the period waiting unit 116, and the reproduction clock unit 102 constitutes a timing control unit 130.

The timing control unit 130 determines a timing for updating the graphic display 210, based on the new display time and the old display time. This timing is the one at which the waiting period has elapsed. The process by the timing control unit 130 is referred to as a timing control process.

The reproduction screen display unit 121 changes the state of the object at the timing determined.

Now, a description will be directed to a relationship among the reproduction unit 110, the reproduction screen display unit 121, and the reproduction clock unit 102 when the forward direction reproduction instruction or the reverse direction reproduction instruction is received.

When the interval between the new display time and the old display time is longer than the upper limit period, the reproduction screen display unit 121 changes the state of the object displayed by the graphic display to a state indicated by the new state value included in the new trace data at the time shifted from the old display time by the upper limit period.

That is, when the period waiting unit 116 outputs an elapse signal, the reproduction screen display unit 121 changes the state of the object to the state indicated by the new state value included in the new trace data.

When the period waiting unit 116 outputs the elapse signal, the reproduction clock unit 102 updates the reproduction time 109 to the new display time.

On the other hand, when the temporary stop instruction is received, the reproduction unit 110, the reproduction screen display unit 121, and the reproduction clock unit 102 temporary stop.

When the forward direction frame feed instruction is received, the reproduction screen display unit 121 changes the state of the object to the state indicated by the new state value included in the new trace data, without waiting for the reproduction time 109 indicated by the reproduction clock unit 102 to become the occurrence time included in the new trace data.

Then, the reproduction clock unit 102 updates the reproduction time 109 to the new display time when the state of the object changes to the state indicated by the new state value included in the new trace data.

\*\*\*Description of Operations\*\*\*

Operations of the simulation reproduction apparatus 100 correspond to a simulation reproduction method. The simulation reproduction method corresponds to a processing procedure of a simulation reproduction program.

Figure 7:
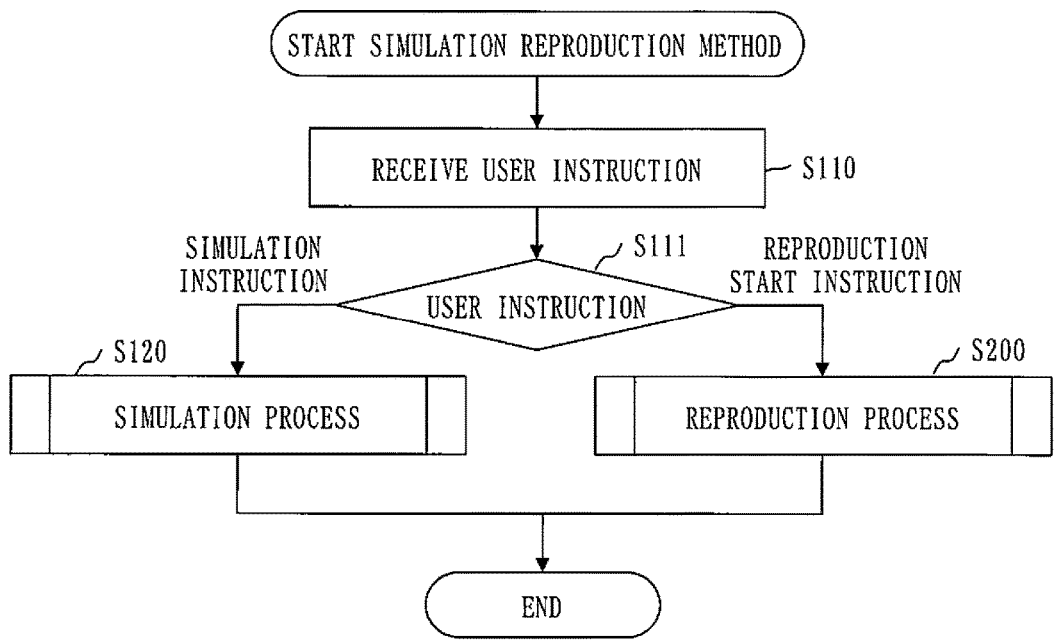
FIG. 7 is a flowchart of a simulation reproduction method in the first embodiment.

The simulation reproduction method will be described, based on FIG. 7.

S110 is a user instruction reception process.

In S110, the reception unit 101 receives a user instruction.

The user instruction received is a simulation instruction or a reproduction start instruction.

If the user instruction received is the simulation instruction in S111, the procedure proceeds to S120.

If the user instruction received is the reproduction start instruction, the procedure proceeds to S200.

S120 is a simulation process.

In S120, the simulation unit 180 simulates an operation of an object by executing the simulation program and generates a trace file 191.

The simulation process (S120) will be described, based on FIG. 8.

In S121, the simulation unit 180 instructs the simulation screen display unit 122 to initialize a graphic display.

Then, the simulation screen display unit 122 displays a simulation screen including a graphic display in an initial state, using a simulation screen file 189.

In S122, the simulation unit 180 starts execution of the simulation program, thereby starting the simulation. Then, the simulation unit 180 stores, in the storage unit 190, a start time at which the simulation has been started.

If a state of the object being simulated has been changed in S123, the procedure proceeds to S124.

If the state of the object being simulated has not been changed, the procedure proceeds to S126.

In S124, the simulation unit 180 generates trace data 191D including an occurrence time, the number of cycles, a object identifier, a new state value, and an old state value, and records, in the trace file 191, the trace data 191D generated.

In S125, the simulation unit 180 inputs the object identifier and the new state value to the simulation screen display unit 122, thereby instructing update of the graphic display.

Then, the simulation screen display unit 122 changes the state of the object identified by the object identifier to a state indicated by the new state value, in the graphic display.

In S125, the simulation unit 180 inputs the state identifier and the new state value to the simulation screen display unit 122, thereby instructing update of the graphic display.

Then, the simulation screen display unit 122 changes the state of the object identified by the state identifier to a state indicated by the new state value, in the graphic display.

If the execution of the simulation program has been finished in S126, the simulation process (S120) is finished.

If the execution of the simulation program has not been finished, the procedure returns to S123.

The description will be continued from S200 by returning to FIG. 7.

S200 is a reproduction process.

In S200, the reproduction unit 110 reproduces an operation of the object by a graphic display, using a trace file 191.

Figure 9:
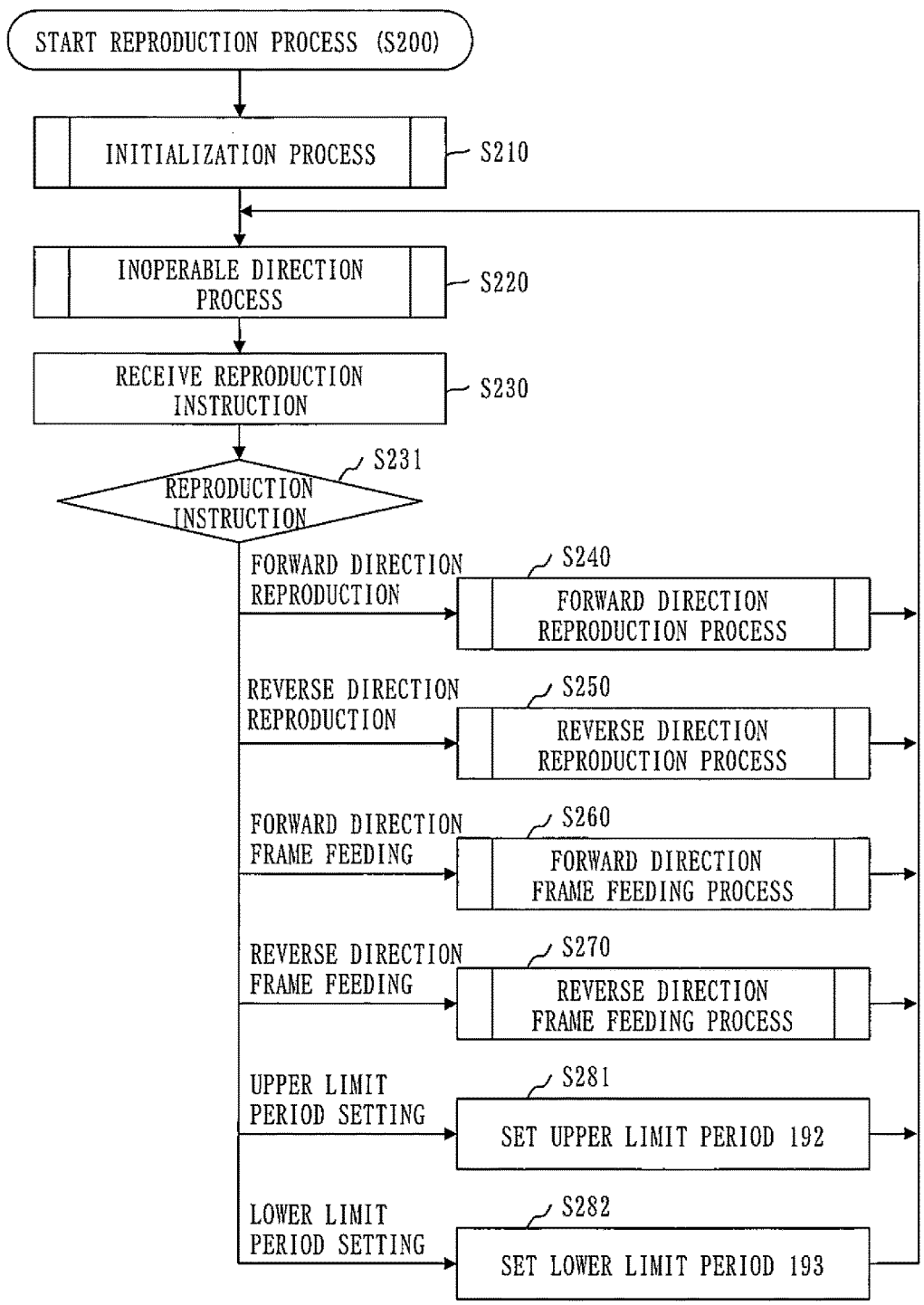
FIG. 9 is a flowchart of a reproduction process (S200) in the first embodiment.

The reproduction process (S200) will be described, based on FIG. 9.

S210 is the initialization process.

In S210, the initialization unit 111 performs the initialization process for starting reproduction of the operation of the object.

Figure 10:
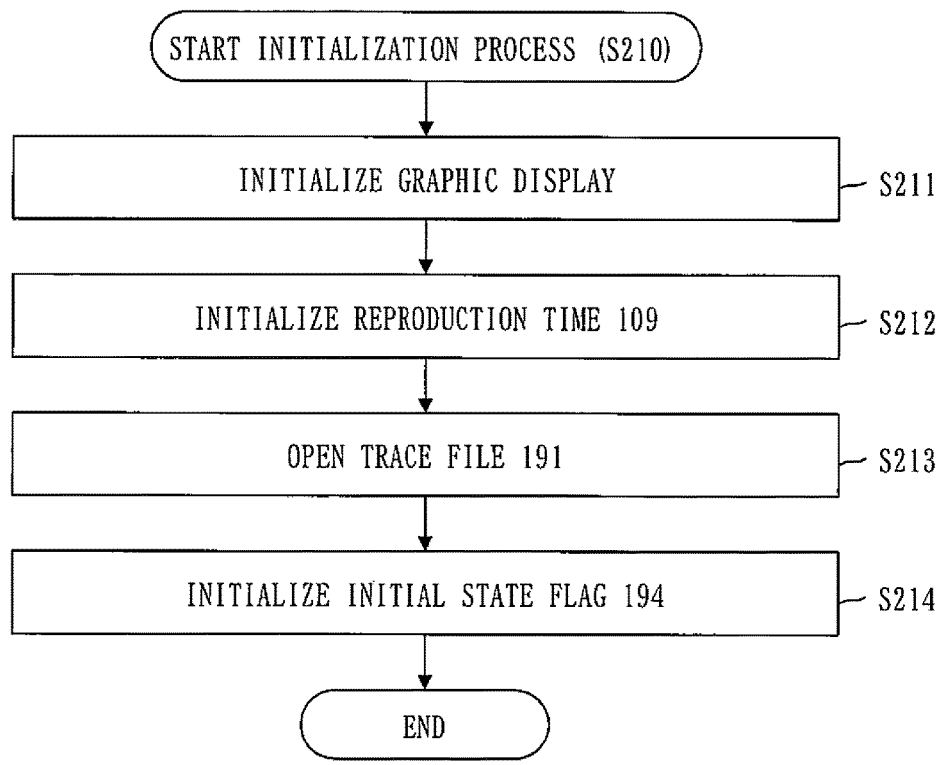
FIG. 10 is a flowchart of an initialization process (S210) in the first embodiment.

The initialization process (S210) will be described, based on FIG. 10.

In S211, the initialization unit 111 instructs the reproduction screen display unit 121 to initialize a graphic display.

Then, the reproduction screen display unit 121 displays a reproduction screen 200 including a graphic display 210 in an initial state, using a reproduction screen file 199.

In S212, the initialization unit 111 instructs the reproduction clock unit 102 to initialize a reproduction time 109.

Then, the reproduction clock unit 102 initializes the reproduction time 109. That is, the reproduction clock unit 102 updates the reproduction time 109 to an initial value. The initial value of the reproduction time 109 is a start time at which simulation has been started.

In S213, the initialization unit 111 opens the trace file 191.

By opening the trace file 191, a file reference pointer indicating a reference position in the trace file 191 is generated. The file reference pointer when the trace file 191 has been opened indicates the beginning of the trace file 191 or trace data 191D at the beginning in the order of times.

In S214, the initialization unit 111 initializes the initial state flag 194. That is, the initialization unit 111 sets an initial state value in the initial state flag 194.

After S214, the initialization process (S210) is finished.

The description will be continued from S220 by returning to FIG. 9.

S220 is an inoperable direction process.

In S220, the inoperable direction determination unit 112 determines an inoperable direction in which the operation of the object cannot be reproduced. The inoperable direction is a forward direction meaning the order of the times or a reverse direction meaning the reverse order of the times.

Then, the reproduction screen display unit 121 disables the button for instructing reproduction in the inoperable direction.

Figure 11:
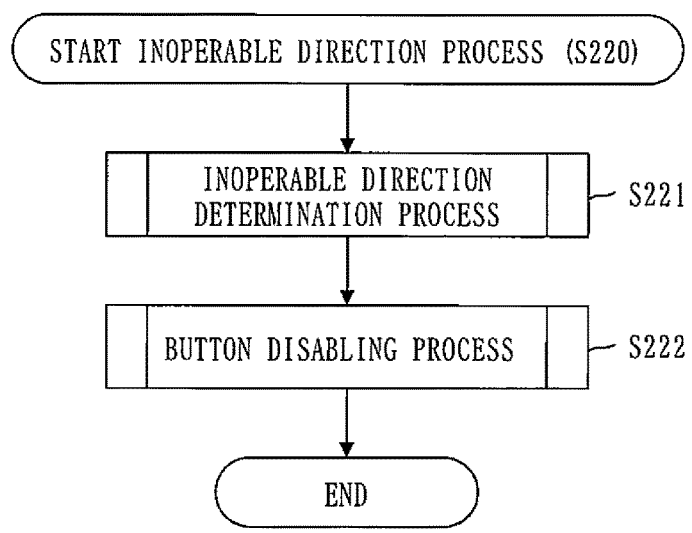
FIG. 11 is a flowchart of an inoperable direction process (S220) in the first embodiment.

The inoperable direction process (S220) will be described, based on FIG. 11.

S221 is the inoperable direction determination process.

In S221, the inoperable direction determination unit 112 determines the inoperable direction in which the operation of the object cannot be reproduced.

Figure 12:
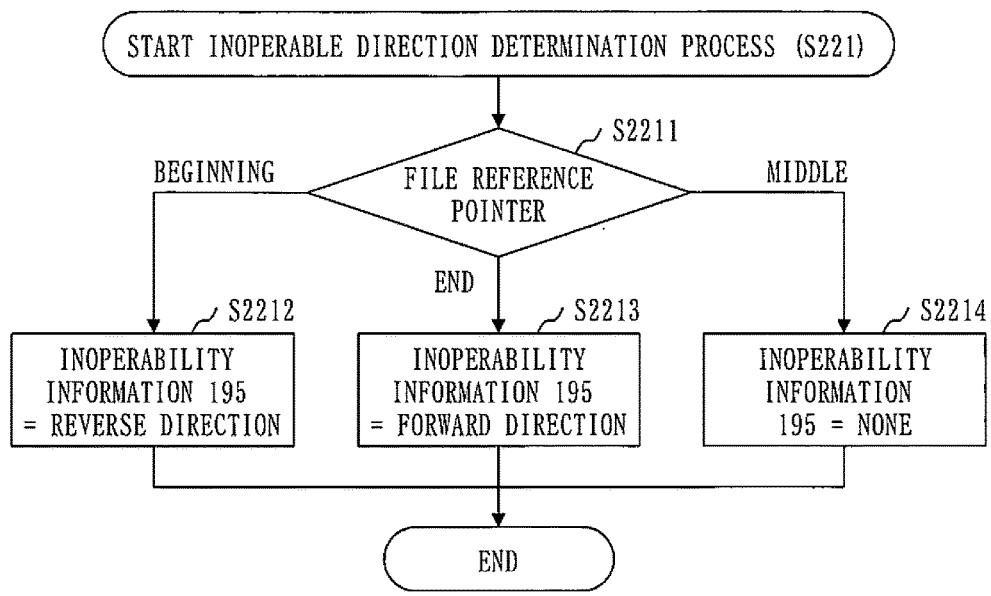
FIG. 12 is a flowchart of an inoperable direction determination process (S221) in the first embodiment.

The inoperable direction determination process (S221) will be described, based on FIG. 12.

In S2211, the inoperable direction determination unit 112 determines a reference position indicated by the file reference pointer.

If the file reference pointer indicates the beginning of the trace file 191, the procedure proceeds to S2212.

If the file reference pointer indicates the end of the trace file 191, the procedure proceeds to S2213.

If the file reference pointer indicates the middle of the trace file 191, the procedure proceeds to S2214.

In S2212, the inoperable direction determination unit 112 sets, in inoperability information 195, a value indicating the reverse direction.

In S2213, the inoperable direction determination unit 112 sets, in the inoperability information 195, a value indicating the forward direction.

In S2214, the inoperable direction determination unit 112 sets, in the inoperability information 195, a value indicating no presence of the inoperable direction.

After S2212 to S2214, the inoperable direction determination process (S221) is finished.

The description will be continued from S222, by returning to FIG. 11.

S222 is a button disabling process.

In S222, the reproduction screen display unit 121 disables the button for instructing the reproduction in the inoperable direction.

After S222, the inoperable direction process (S220) is finished.

Figure 13:
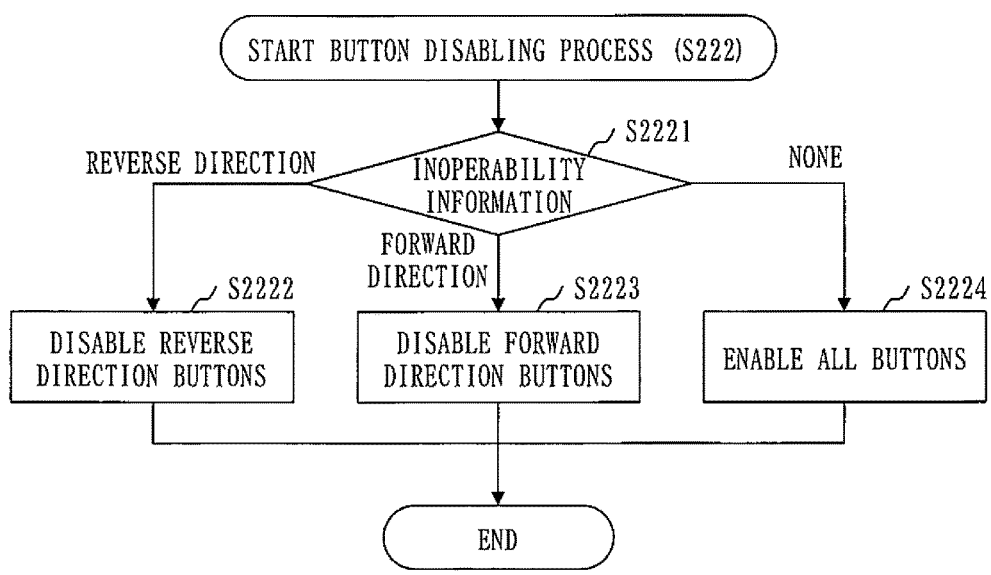
FIG. 13 is a flowchart of a button disabling process (S222) in the first embodiment.

The button disabling process (S222) will be described, based on FIG. 13.

In S2221, the reproduction control unit 119 determines the inoperable direction indicated by the inoperability information 195.

If the inoperability information 195 indicates the reverse direction, the procedure proceeds to S2222.

If the inoperability information 195 indicates the forward direction, the procedure proceeds to S2223.

If the inoperability information 195 indicates no presence of the inoperable direction, the procedure proceeds to S2224.

In S2222, the reproduction control unit 119 instructs the reproduction screen display unit 121 to disable the reverse direction reproduction button 222 and the reverse direction frame feed button 224.

Then, the reproduction screen display unit 121 disables the reverse direction reproduction button 222 and the reverse direction frame feed button 224. Further, if the forward direction reproduction button 221 and the forward direction frame feed button 223 are disabled, the reproduction screen display unit 121 enables the forward direction reproduction button 221 and the forward direction frame feed button 223.

In S2223, the reproduction control unit 119 instructs the reproduction screen display unit 121 to disable the forward direction reproduction button 221 and the forward direction frame feed button 223.

Then, the reproduction screen display unit 121 disables the forward direction reproduction button 221 and the forward direction frame feed button 223. Further, if the reverse direction reproduction button 222 and the reverse direction frame feed button 224 are disabled, the reproduction screen display unit 121 enables the reverse direction reproduction button 222 and the reverse direction frame feed button 224.

In S2224, the reproduction control unit 119 instructs the reproduction screen display unit 121 to enable the buttons for instructing the reproductions.

Then, the reproduction screen display unit 121 enables one or more disabled buttons among the forward direction reproduction button 221, the reverse direction reproduction button 222, the forward direction frame feed button 223, and the reverse direction frame feed button 224.

After S2222 to S2224, the button disabling process (S222) is finished.

The description will be continued from S230 by returning to FIG. 9.

S230 is a reproduction instruction reception process.

In S230, the reception unit 101 receives a reproduction instruction.

The reproduction instruction received is a forward direction reproduction instruction, a reverse direction reproduction direction, a forward direction frame feed instruction, a reverse direction frame feed instruction, an upper limit period setting instruction, or a lower limit period setting instruction.

If the reproduction instruction received is the forward direction reproduction instruction in S231, the procedure proceeds to S240.

If the reproduction instruction received is the reverse direction reproduction instruction, the procedure proceeds to S250.

If the reproduction instruction received is the forward direction frame feed instruction, the procedure proceeds to S260.

If the reproduction instruction received is the reverse direction frame feed instruction, the procedure proceeds to S270.

If the reproduction instruction received is the upper limit period setting instruction, the procedure proceeds to S281.

If the reproduction instruction received is the lower limit period setting instruction, the procedure proceeds to S282.

S240 is a forward direction reproduction process.

In S240, the reproduction unit 110 reproduces the operation of the object in the forward direction.

Details of the forward direction reproduction process (S240) will be described later.

After S240, the procedure returns to S220.

S250 is a reverse direction reproduction process.

In S250, the reproduction unit 110 reproduces the operation of the object in the reverse direction.

Details of the reverse direction reproduction process (S250) will be described later.

After S250, the procedure returns to S220.

S260 is a forward direction frame feeding process.

In S260, the reproduction unit 110 changes a state of the object once in the order of the times.

Details of the forward direction frame feeding process (S260) will be described later.

After S260, the procedure returns to S220.

S270 is a reverse direction frame feeding process.

In S270, the reproduction unit 110 changes a state of the object once in the reverse order of the times.

Details of the reverse direction frame feeding process (S270) will be described later.

After S270, the procedure returns to S220.

S281 is the upper limit period setting process.

In S281, the period setting unit 117 updates an upper limit period 192 stored in the storage unit 190 to an upper limit period specified by the upper limit period setting instruction.

After S281, the procedure returns to S220.

S282 is the lower limit period setting process.

In S282, the period setting unit 117 updates a lower limit period 193 stored in the storage unit 190 to a lower limit period specified by the lower limit period setting instruction.

After S282, the procedure returns to S220.

Figure 14:
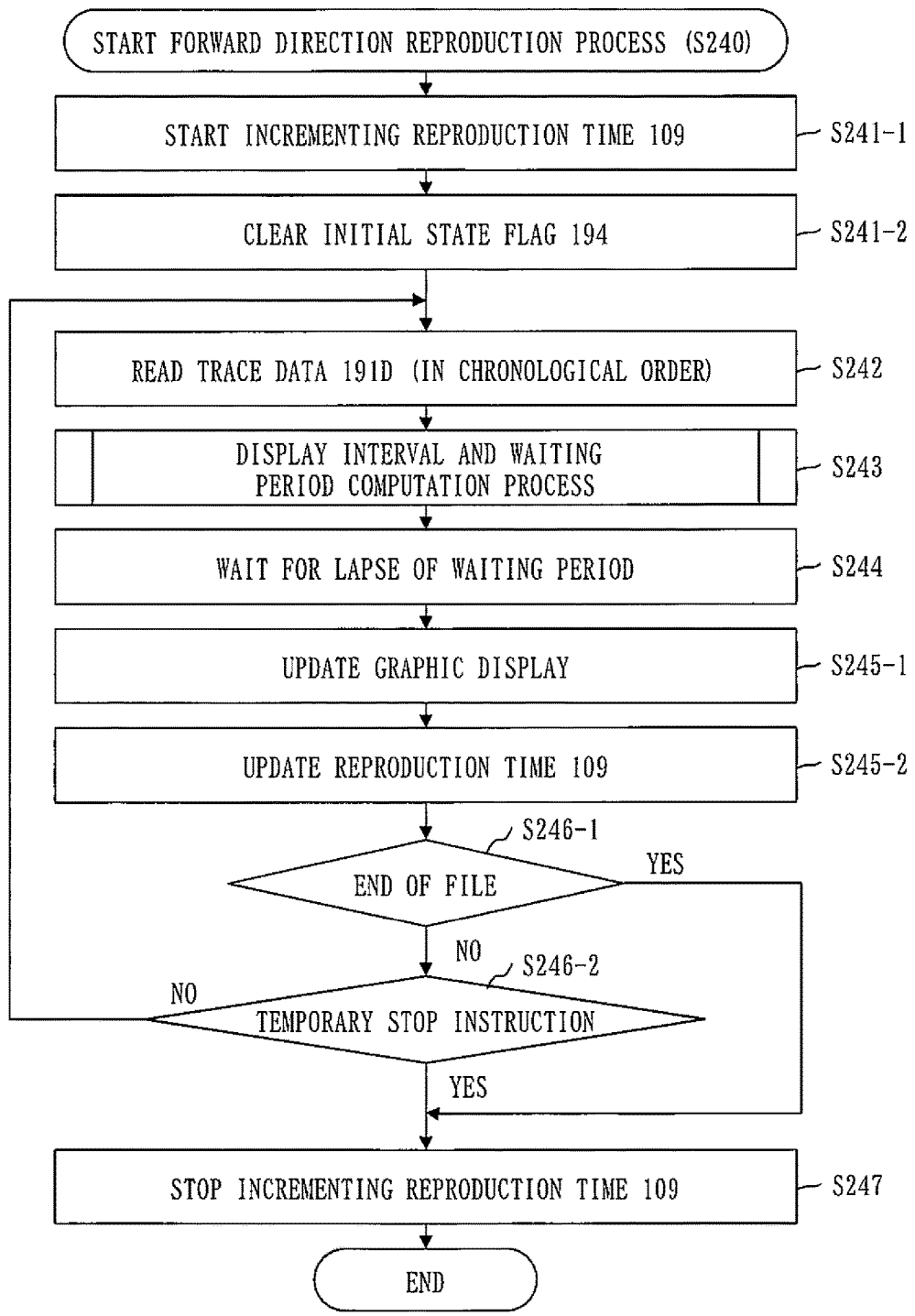
FIG. 14 is a flowchart of a forward direction reproduction process (S240) in the first embodiment.

The forward direction reproduction process (S240) will be described, based on FIG. 14.

In S241-1, the reproduction control unit 119 instructs the reproduction clock unit 102 to start incrementing the reproduction time 109.

Then, the reproduction clock unit 102 starts incrementing the reproduction time 109. That is, the reproduction clock unit 102 causes the reproduction time 109 to proceed in the order of the times.

In S242-2, the reproduction control unit 119 clears the initial state flag 194. That is, the reproduction control unit 119 updates the flag value of the initial state flag 194 to the non-initial state value.

S242 is a trace data reading process.

In S242, the trace data reading unit 113 reads trace data 191D indicated by the file reference pointer from the trace file 191.

Then, the trace data reading unit 113 updates the file reference pointer to a value indicating trace data 191D that is subsequent in the order of the times. This allows the trace data 191D to be read one piece by one piece in the order of the times.

However, if there is no trace data 191D that is subsequent in the order of the times, or if the file reference pointer indicates last trace data 191D, the trace data reading unit 113 updates the file reference pointer to a value indicating the end of the trace file 191.

S243 is a display interval and waiting period computation process.

In S243, the display interval computation unit 114 computes a display interval from an old display time to a new display time, and the waiting period computation unit 115 computes a waiting period to the new display time.

Details of the display interval and waiting period computation process (S243) will be described later.

In S244, the period waiting unit 116 starts a waiting period timer in which the computed waiting period is set, and waits until the waiting period timer times out. The waiting period timer is a timer to time out when the waiting period has elapsed.

However, if the computed waiting period is 0 or less, S244 is not executed, and the procedure proceeds to S245-1.

In S245-1, the reproduction control unit 119 computes the new number of clocks, using the new display time. Further, the reproduction control unit 119 acquires an object identifier and a new state value from the trace data 191D that has been read. Then, the reproduction control unit 119 inputs the new display time, the new number of clocks, the object identifier, and the new state value to the reproduction screen display unit 121.

The new number of clocks can be expressed by the following equation:

new number of clocks=new display time/virtual clock period

The reproduction screen display unit 121 changes, on the graphic display 210 of the reproduction screen 200, a state of the object to be identified by the input object identifier to a state indicated by the input new state value. The reproduction screen display unit 121 updates the reproduction time displayed on the graphic display 210 to the input new display time, and updates the number of clocks displayed on the graphic display 210 to the input new number of clocks.

In S245-2, the reproduction control unit 119 inputs the new display time to the reproduction clock unit 102.

Then, the reproduction clock unit 102 updates the reproduction time 109 to the new display time, and causes the reproduction time 109 after the update to proceed in the order of the times.

In S246-1, the trace data reading unit 113 determines whether the file reference pointer indicates the end of the trace file 191.

If the file reference pointer indicates the end of the trace file 191, the procedure proceeds to S247.

If the file reference pointer does not indicate the end of the trace file 191, the procedure proceeds to S246-2.

In S246-2, the reproduction control unit 119 inquires the reception unit 101 about whether a temporary stop instruction has been received after the forward direction reproduction process (S240) was started.

If the temporary stop instruction has been received after the forward direction reproduction process (S240) was started, the procedure proceeds to S247.

If the temporary stop instruction has not been received after the forward direction reproduction process (S240) was started, the procedure returns to S242.

In S247, the reproduction control unit 119 instructs the reproduction clock unit 102 to stop incrementing the reproduction time 109.

Then, the reproduction clock unit 102 stops incrementing the reproduction time 109. That is, the reproduction clock unit 102 stops the operation.

After S247, the forward direction reproduction process (S240) is finished.

Figure 15:
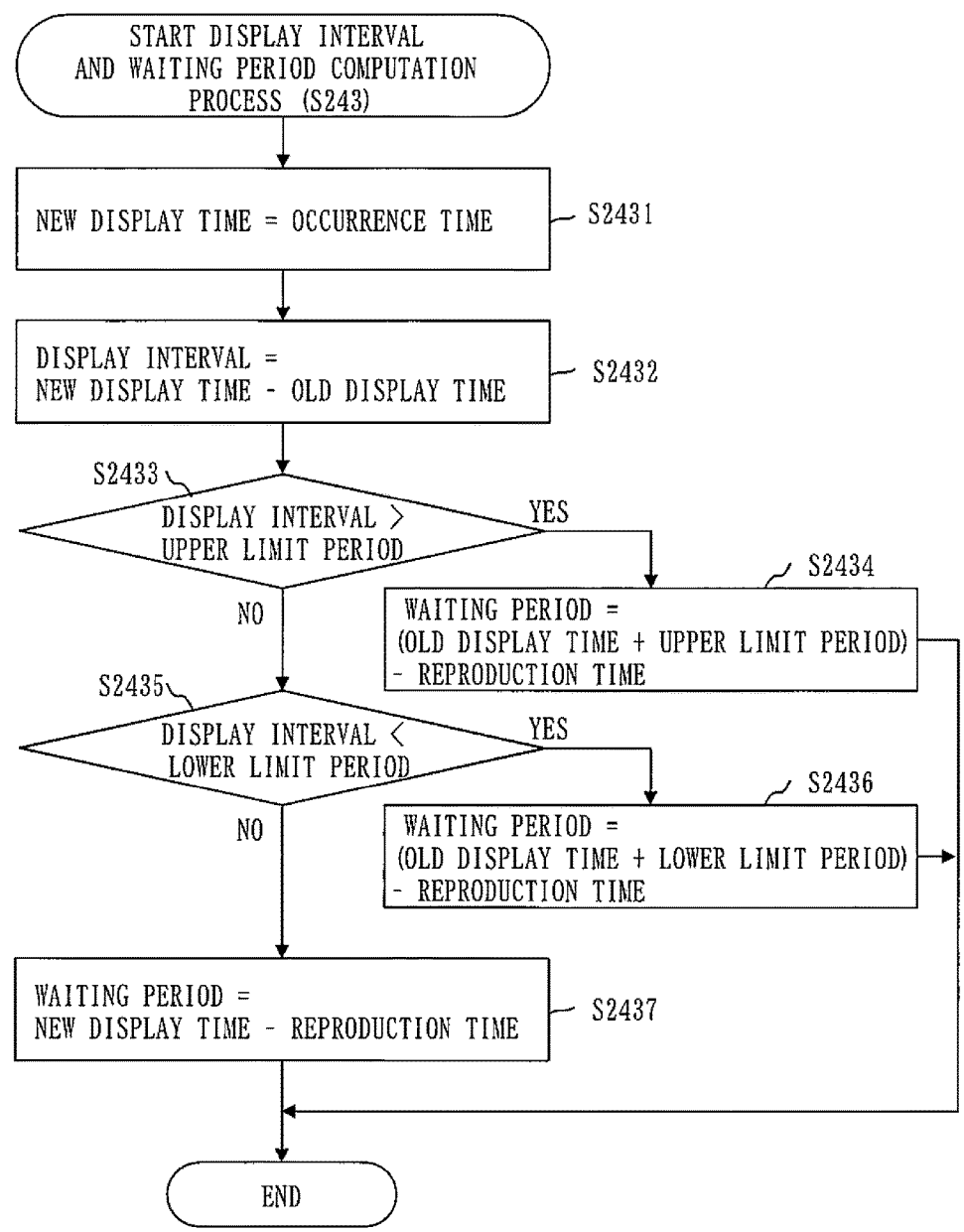
FIG. 15 is a flowchart of a display interval and waiting period computation process (S243) in the first embodiment.

The display interval and the waiting period computation process (S243) will be described, based on FIG. 15.

In S2431, the display interval computation unit 114 acquires an occurrence time from the trace data 191D read this time, and sets the acquired occurrence time to the new display time.

The new display time is expressed by the following equation:

$$\text{new display time} = \text{occurrence time}$$

S2432 is a display interval computation process.

In S2432, the display interval computation unit 114 computes the display interval from the old display time to the new display time. The old display time is a new display time computed last time. However, if there is not the new display time computed the last time, or the new display time has been computed for the first time, the old display time is the initial value of the reproduction time 109.

The display interval can be expressed by the following equation:

$$\text{display interval} = \text{new display time} - \text{old display time}$$

In S2433, the waiting period computation unit 115 compares the computed display interval with the upper limit period 192.

If the computed display interval is longer than the upper limit period 192, the procedure proceeds to S2434.

If the computed display interval is less than the upper limit period 192, the procedure proceeds to S2435.

In S2434, the waiting period computation unit 115 acquires from the reproduction clock unit 102 the reproduction time 109 at a current time.

Then, the waiting period computation unit 115 computes an interval between the reproduction time 109 at the current time and a time at which the upper limit period 192 elapses from the old display time, as the waiting period.

The waiting period can be expressed by the following equation:

$$\text{waiting period} = (\text{old display time} + \text{upper limit period}) - \text{reproduction time}$$

After S2434, the display interval and waiting period computation process (S243) is finished.

In S2435, the waiting period computation unit 115 compares the computed display period with the lower limit period 193.

If the computed display interval is shorter than the lower limit period 193, the procedure proceeds to S2436.

If the computed display interval is more than the lower limit period 193, the procedure proceeds to S2437.

In S2436, the waiting period computation unit 115 acquires, from the reproduction clock unit 102, the reproduction time 109 at the current time.

Then, the waiting period computation unit 115 computes an interval between the reproduction time 109 at the current time and a time at which the lower limit period 193 elapses from the old display time, as the waiting period.

The waiting period can be expressed by the following equation:

$$\text{waiting period} = (\text{old display time} + \text{lower limit period}) - \text{reproduction time}$$

After S2436, the display interval and waiting period computation process (S243) is finished.

In S2437, the waiting period computation unit 115 acquires, from the reproduction clock unit 102, the reproduction time 109 at the current time.

Then, the waiting period computation unit 115 computes an interval from the reproduction time 109 at the current time to the new display time, as the waiting period.

The waiting period can be expressed by the following equation:

$$\text{waiting period} = \text{new display time} - \text{reproduction time}$$

After S2437, the display interval and waiting period computation process (S243) is finished.

Figure 16:
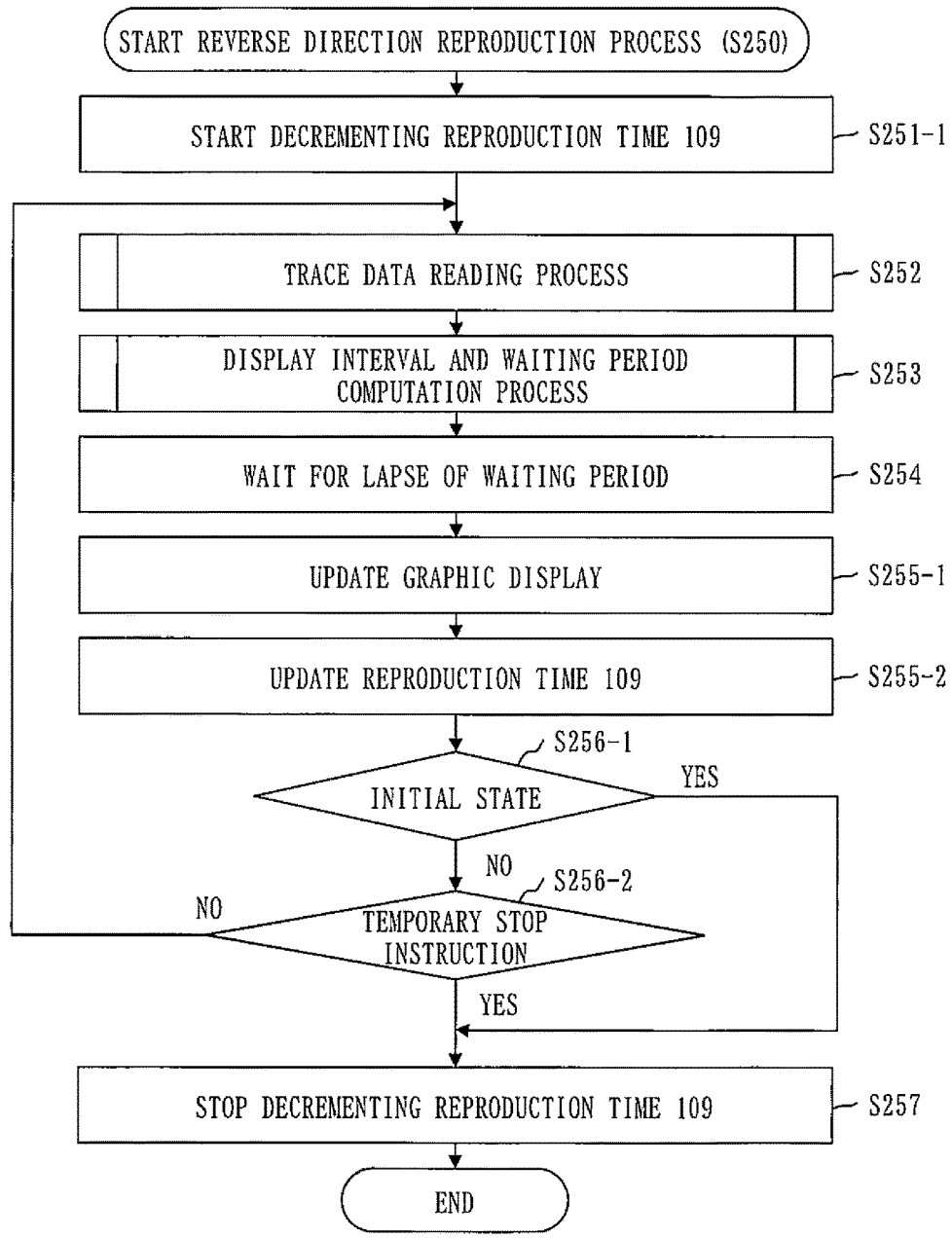
FIG. 16 is a flowchart of a reverse direction reproduction process (S250) in the first embodiment.

The reverse direction reproduction process (S250) will be described, based on FIG. 16.

In S251-1, the reproduction control unit 119 instructs the reproduction clock unit 102 to start decrementing the reproduction time 109.

Then, the reproduction clock unit 102 starts decrementing the reproduction time 109. That is, the reproduction clock unit 102 causes the reproduction time 109 to proceed in the reverse order of the times.

S252 is a trace data reading process.

In S252, the trace data reading unit 113 reads, from the trace file 191, one piece of trace data 191D in the reverse order of the times.

Details of the trace data reading process (S252) will be described later.

S253 is a display interval and waiting period computation process.

In S253, the display interval computation unit 114 computes a display interval from a new display time to an old display time, and the waiting period computation unit 115 computes a waiting period to the new display time.

Details of the display interval and waiting period computation process (S253) will be described later.

In S254, the period waiting unit 116 starts the waiting period timer in which the computed waiting period is set, and waits until the waiting period timer times out. The waiting period timer is the timer to time out when the waiting period elapses. However, if the computed waiting period is 0 or less, S254 is not executed, and the procedure proceeds to S255-1.

In S255-1, the reproduction control unit 119 computes the new number of clocks, using the new display time. Further, the reproduction control unit 119 acquires an object identifier and an old state value from the trace data 191D that has been read. Then, the reproduction control unit 119 inputs the new display time, the new number of clocks, the object identifier, and the old state value to the reproduction screen display unit 121.

The new number of clocks can be expressed by the following expression:

new number of clocks=new display time/virtual
   clock period

The reproduction screen display unit 121 changes, on the graphic display 210 of the reproduction screen 200, a state of the object to be identified by the input object identifier to a state indicated by the input old state value. The reproduction screen display unit 121 updates the reproduction time displayed on the graphic display 210 to the input new display time, and updates the number of clocks displayed on the graphic display 210 to the input new number of clocks.

In S255-2, the reproduction control unit 119 inputs the new display time to the reproduction clock unit 102.

Then, the reproduction clock unit 102 updates the reproduction time 109 to the new display time, and causes the reproduction time 109 after the update to proceed in the reverse order of the times.

In S256-1, the trace data reading unit 113 determines whether the flag value of the initial state flag 194 is the initial state value.

If the flag value of the initial state flag 194 is the initial state value, the procedure proceeds to S257.

If the flag value of the initial state flag 194 is the non-initial state value, the procedure proceeds to S256-2.

In S256-2, the reproduction control unit 119 inquires the reception unit 101 about whether a temporary stop instruction has been received after the reverse direction reproduction process (S250) was started.

If the temporary stop instruction has been received after the reverse direction reproduction process (S250) was started, the procedure proceeds to S257.

If the temporary stop instruction has not been received after the reverse direction reproduction process (S250) was started, the procedure returns to S252.

In S257, the reproduction control unit 119 instructs the reproduction clock unit 102 to stop decrementing the reproduction time 109.

Then, the reproduction clock unit 102 stops decrementing the reproduction time 109. That is, the reproduction clock unit 102 stops the operation.

After S257, the reverse direction reproduction process (S250) is finished.

Figure 17:
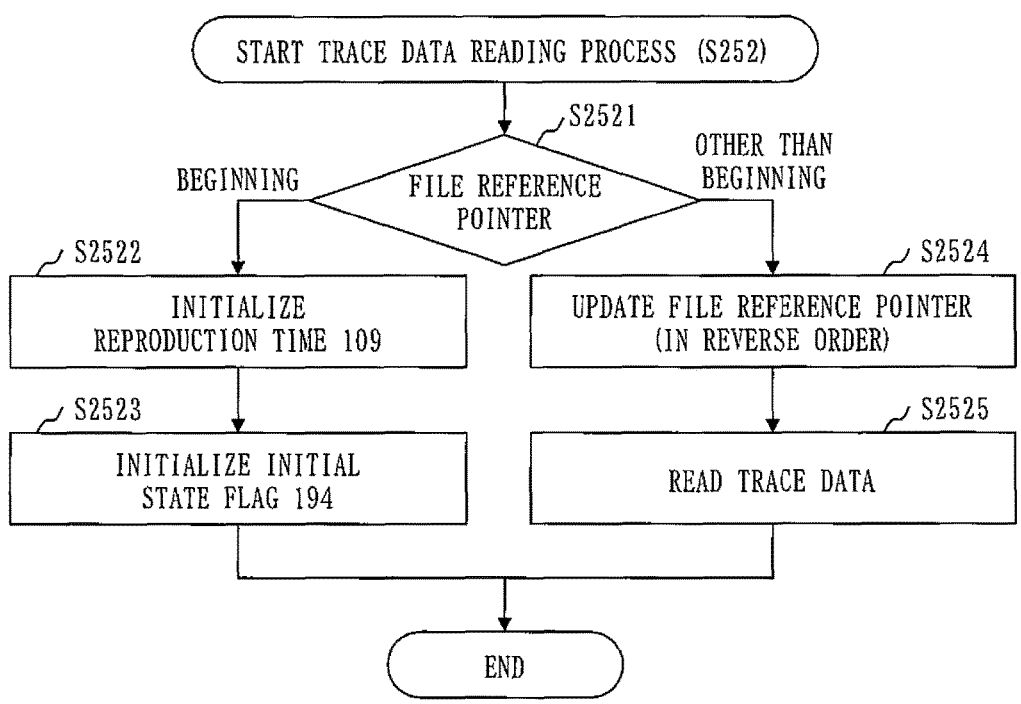
FIG. 17 is a flowchart of a trace data reading process (S252) in the first embodiment.

The trace data reading process (S252) will be described, based on FIG. 17.

In S2521, the reproduction control unit 119 determines whether the file reference pointer indicates the beginning of the trace file 191 or the trace data 191D at the beginning in the order of the times.

If the file reference pointer indicates the beginning of the trace file 191, the procedure proceeds to S2522.

If the file reference pointer indicates a portion other than the beginning of the trace file 191, the procedure proceeds to S2524.

In S2522, the reproduction control unit 119 instructs the reproduction clock unit 102 to initialize the reproduction time 109.

Then, the reproduction control unit 119 initializes the reproduction time 109. That is, the reproduction control unit 119 updates the reproduction time 109 to the initial value.

In S2523, the reproduction control unit 119 initializes the initial state flag 194. That is, the reproduction control unit 119 updates the flag value of the initial state flag 194 to the initial state value.

After S2523, the trace data reading process (S252) is finished.

In S2524, the reproduction control unit 119 updates the file reference pointer to a value indicating trace data 191D that is subsequent in the reverse order of the times.

In S2525, the trace data reading unit 113 reads, from the trace file 191, the trace data 191D indicated by the file reference pointer.

After S2525, the trace data reading process (S252) is finished.

Figure 18:
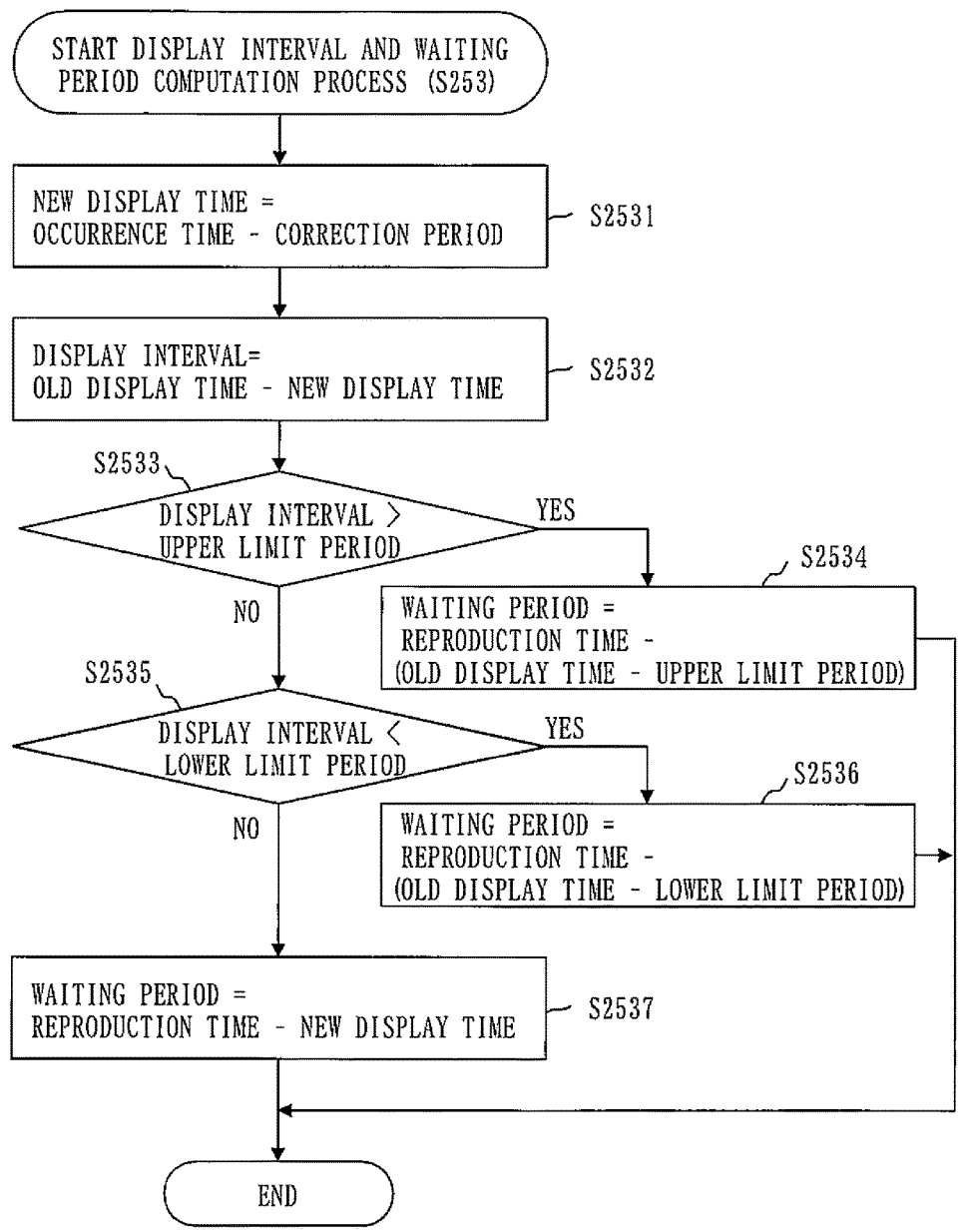
FIG. 18 is a flowchart of a display interval and waiting period computation process (S253) in the first embodiment.

The display interval and waiting period computation process (S253) will be described, based on FIG. 18.

In S2531, the display interval computation unit 114 acquires an occurrence time from the trace data 191D read this time, and computes a time traced back from the acquired occurrence time by the correction period, as the new display time. This new display time means a time immediately before the state of the object changes.

The new display time can be expressed by the following equation:

new display time=occurrence time−correct time

S2532 is a display interval computation process.

In S2532, the display interval computation unit 114 computes the display interval from the old display time to the new display time. The old display time is a new display time computed last time. The display interval can be expressed by the following equation:

display interval=old display time−new display time

In S2533, the waiting period computation unit 115 compares the computed display interval with the upper limit period 192.

If the computed display interval is longer than the upper limit period 192, the procedure proceeds to S2534.

If the computed display interval is less than the upper limit period 192, the procedure proceeds to S2535.

In S2534, the waiting period computation unit 115 acquires, from the reproduction clock unit 102, the reproduction time 109 at a current time.

Then, the waiting period computation unit 115 computes an interval between the reproduction time 109 at the current time and a time traced back from the old display time by the upper limit period 192, as the waiting period.

The waiting period can be expressed by the following equation:

waiting period=reproduction time−(old display time−
   upper limit period)

After S2534, the display interval and waiting period computation process (S253) is finished.

In S2535, the waiting period computation unit 115 compares the computed display interval with the lower limit period 193.

If the computed display interval is shorter than the lower limit period 193, the procedure proceeds to S2536.

If the computed display interval is more than the lower limit period 193, the procedure proceeds to S2537.

In S2536, the waiting period computation unit 115 acquires, from the reproduction clock unit 102, the reproduction time 109 at the current time.

Then, the waiting period computation unit 115 computes an interval between the reproduction time 109 at the current time and a time traced back from the old display time by the lower limit period 193, as the waiting period.

The waiting period can be expressed by the following equation:

waiting period=reproduction time−(old display time−
   lower limit period)

After S2536, the display interval and waiting period computation process (S253) is finished.

In S2537, the waiting period computation unit 115 acquires, from the reproduction clock unit 102, the reproduction time 109 at the current time.

Then, the waiting period computation unit 115 computes an interval from the reproduction time 109 at the current time to the new display time, as the waiting period.

The waiting period can be expressed by the following equation:

waiting period=reproduction time−new display time

After S2537, the display interval and waiting period computation process (S253) is finished.

Figure 19:
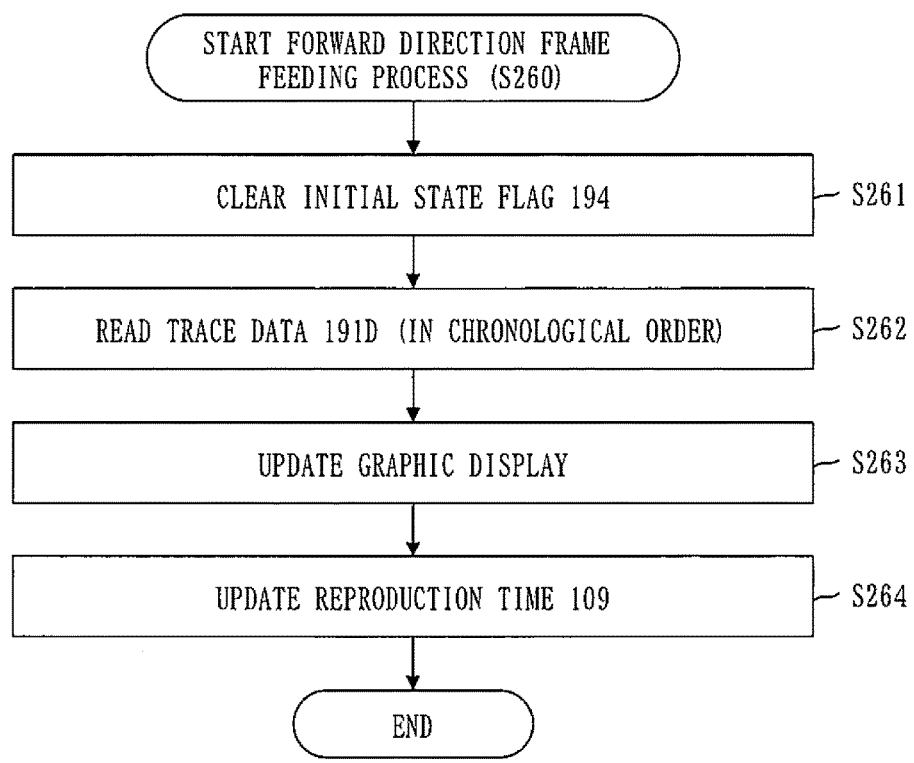
FIG. 19 is a flowchart of a forward direction frame feeding process (S260) in the first embodiment.

The forward direction frame feeding process (S260) will be described, based on FIG. 19.

In S261, the reproduction control unit 119 clears the initial state flag 194. That is, the reproduction control unit 119 updates the flag value of the initial state flag 194 to the non-initial state value.

In S262, the trace data reading unit 113 reads, from the trace file 191, trace data 191D indicated by the file reference pointer.

Then, the trace data reading unit 113 updates the file reference pointer to a value indicating trace data 191D that is subsequent in the order of the times.

However, if there is no trace data 191D that is subsequent in the order of the times, or if the file reference pointer indicates the last trace data 191D, the trace data reading unit 113 updates the file reference pointer to the value indicating the end of the trace file 191.

In S263, the reproduction control unit 119 acquires an occurrence time, the number of cycles, an object identifier, and a new state value from the trace data 191D that has been read, and inputs, to the reproduction screen display unit 121, the occurrence time, the number of cycles, the object identifier, and the new state value that have been acquired.

The reproduction screen display unit 121 changes, on the graphic display 210 of the reproduction screen 200, a state of the object to be identified by the input object identifier to a state indicated by the input new state value. The reproduction screen display unit 121 updates the reproduction time displayed on the graphic display 210 to the input occurrence time, and updates the number of clocks displayed on the graphic display 210 to the input number of cycles.

In S264, the reproduction control unit 119 inputs the acquired occurrence time to the reproduction clock unit 102.

Then, the reproduction clock unit 102 updates the reproduction time 109 to the occurrence time.

After S264, the forward direction frame feeding process (S260) is finished.

Figure 20:
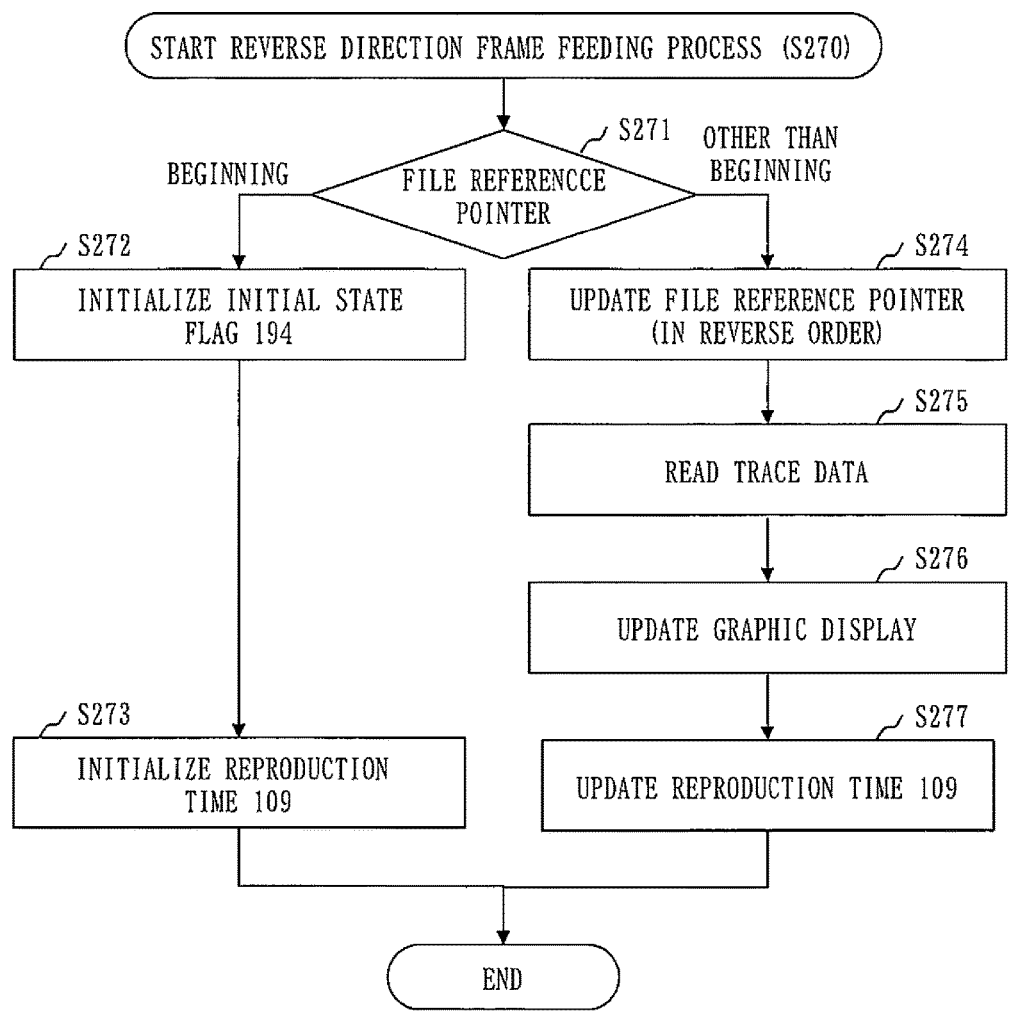
FIG. 20 is a flowchart of a reverse direction frame feeding process (S270) in the first embodiment.

The reverse frame feeding process (S270) will be described, based on FIG. 20.

In S271, the reproduction control unit 119 determines whether the file reference pointer indicates the beginning of the trace file 191 or the trace data 191D at the beginning in the order of the times.

If the file reference pointer indicates the beginning of the trace file 191, the procedure proceeds to S272.

If the file reference pointer indicates a portion other than the beginning of the trace file 191, the procedure proceeds to S274.

In S272, the reproduction control unit 119 initializes the initial state flag 194. That is, the reproduction control unit 119 updates the flag value of the initial state flag 194 to the initial state value.

In S273, the reproduction control unit 119 instructs the reproduction clock unit 102 to initialize the reproduction time 109.

Then, the reproduction clock unit 102 initializes the reproduction time 109. That is, the reproduction clock unit 102 updates the reproduction time 109 to the initial value.

After S273, the reverse frame feeding process (S270) is finished.

In S274, the reproduction control unit 119 updates the file reference pointer to a value indicating trace data 191D that is subsequent in the reverse order of the times.

In S275, the trace data reading unit 113 reads, from the trace file 191, the trace data 191D indicated by the file reference pointer.

In S276, the reproduction control unit 119 acquires, from the trace data 191D that has been read, an occurrence time, an object identifier, and an old state value.

The reproduction control unit 119 computes a time traced back from the acquired occurrence time by the correction period, as a new display time. This new display time means a time immediately before a state of the object changes.

The new display time can be expressed by the following equation:

new display time=occurrence time−correction period

Further, the reproduction control unit 119 computes the new number of clocks, using the new display time computed.

The new number of clocks can be expressed by the following equation:

new number of clocks=new display time/virtual clock period

Then, the reproduction control unit 119 inputs the new display time, the new number of clocks, the object identifier, and the old state value to the reproduction screen display unit 121.

The reproduction screen display unit 121 changes, on the graphic display 210 of the reproduction screen 200, the state of the object to be identified by the input object identifier to a state indicated by the old state value. Further, the reproduction screen display unit 121 updates the reproduction time displayed on the graphic display 210 to the input new display time, and updates the number of clocks displayed on the graphic display 210 to the input new number of clocks.

In S277, the reproduction control unit 119 inputs the new display time to the reproduction clock unit 102.

Then, the reproduction clock unit 102 updates the reproduction time 109 to the new display time.

After S277, the reverse direction frame feeding process (S270) is finished.

*Description of Effects*

The simulation reproduction apparatus 100 temporarily stops a change in a state of the object according to the temporary stop instruction, and causes the state of the object to change once in the reverse order of the times according to the reverse frame feed instruction. Therefore, the user may identify the change of the object by tracing back. Then, when a defect occurs, identification of the cause of the defect becomes facilitated.

The simulation reproduction apparatus 100 changes a state of the object one by one according to each of the forward direction frame feed instruction and the reverse direction frame feed instruction. Therefore, the user may identify the change in the state of the object one by one.

The simulation reproduction apparatus 100 successively changes states of the object according to the reverse direction reproduction instruction in the reverse order of the times. Therefore, the user may successively identify the changes in the states of the object in the reverse order of the times according to one reverse direction reproduction instruction, even if he does not execute the reverse direction frame feed instruction a plurality of times.

The simulation reproduction apparatus 100 sets the upper limit period 192 according to the upper limit period setting instruction, and sets a display continuation period of the object whose state remains unchanged to be shorter than the upper limit period 192. Therefore, when a state of the object does not change for a long period of time, the user may shorten a period of time needed for the identification work by shortening the upper limit period 192 using the upper limit period setting instruction.

The simulation reproduction apparatus 100 sets the lower limit period 193 according to the lower limit period setting instruction, and sets a display continuation period of the object whose state remains unchanged to be longer than the lower limit period 193. Therefore, when a state of the object changes at high speed, the user may prevent an overlook in the identification by extending the lower limit period 193 using the lower limit period setting instruction.

The simulation reproduction apparatus 100 applies both of the upper limit period 192 and the lower limit period 193. Therefore, the user may obtain both effects of shortening and extension with regard to the display continuation period of the object whose state remains unchanged.

When performing reverse direction reproduction or reverse direction frame feeding, the simulation reproduction apparatus 100 displays, on the graphic display 210, a time traced back from an occurrence time by the correction period that is the minute period. This may prevent confusion of the user in the identification work during the reverse direction reproduction or the reverse direction frame feeding.

Assume, for example, that a state change of the object from a first state to a second state has occurred at a first time. Then, assume that when reverse direction reproduction starts, a display time remains unchanged from the first time and the state of the object returns to the first state from the second state. Then, the confusion of the user may be brought about. On the other hand, assume that the display time is changed from the first time to a time traced back by a minute period. Then, even if the state of the object returns to the first state from the second state, the confusion of the user will not be brought about.

Second Embodiment

Figure 22:
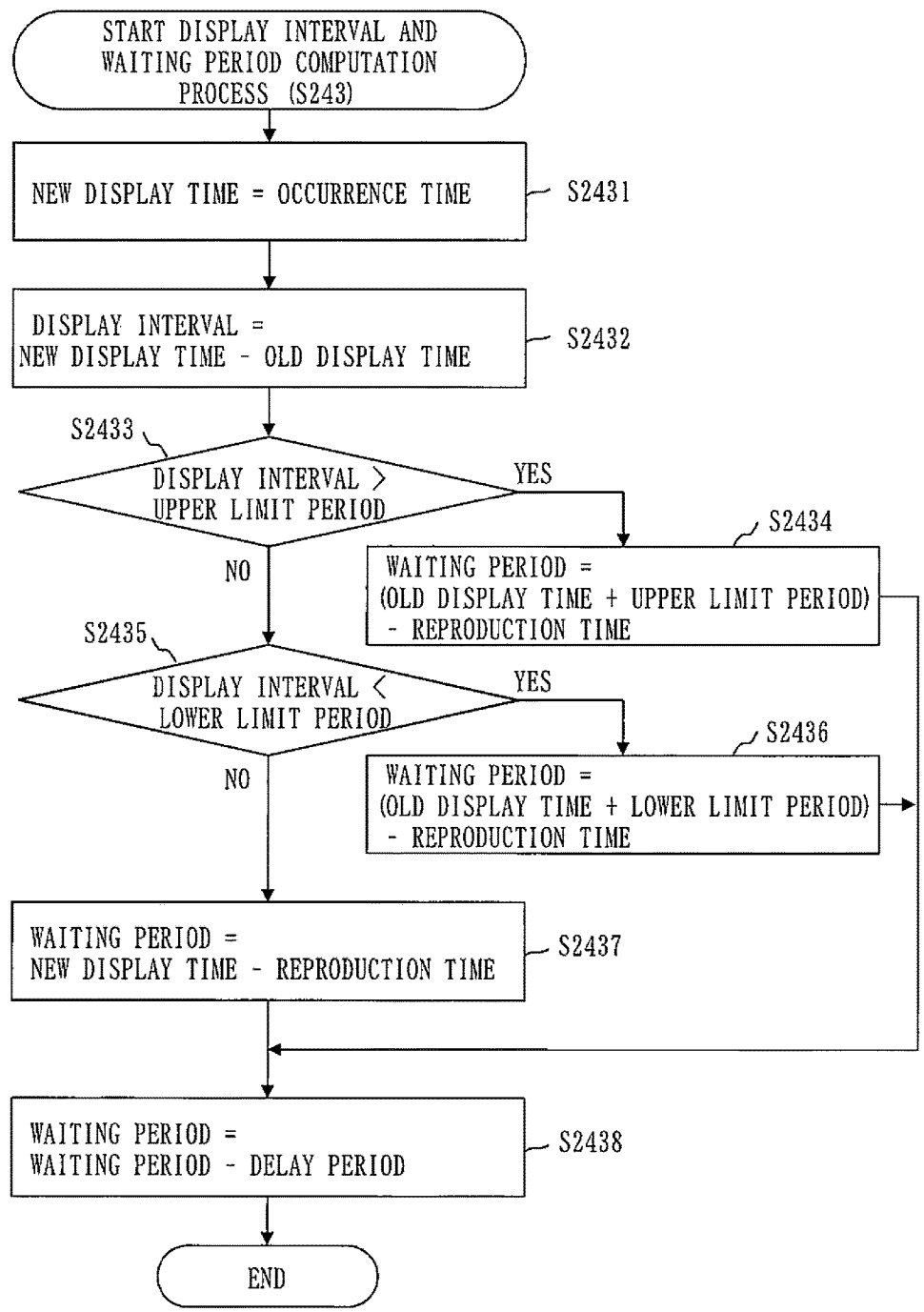
FIG. 22 is a flowchart of a display interval and waiting period computation process (S243) in the second embodiment.
Figure 23:
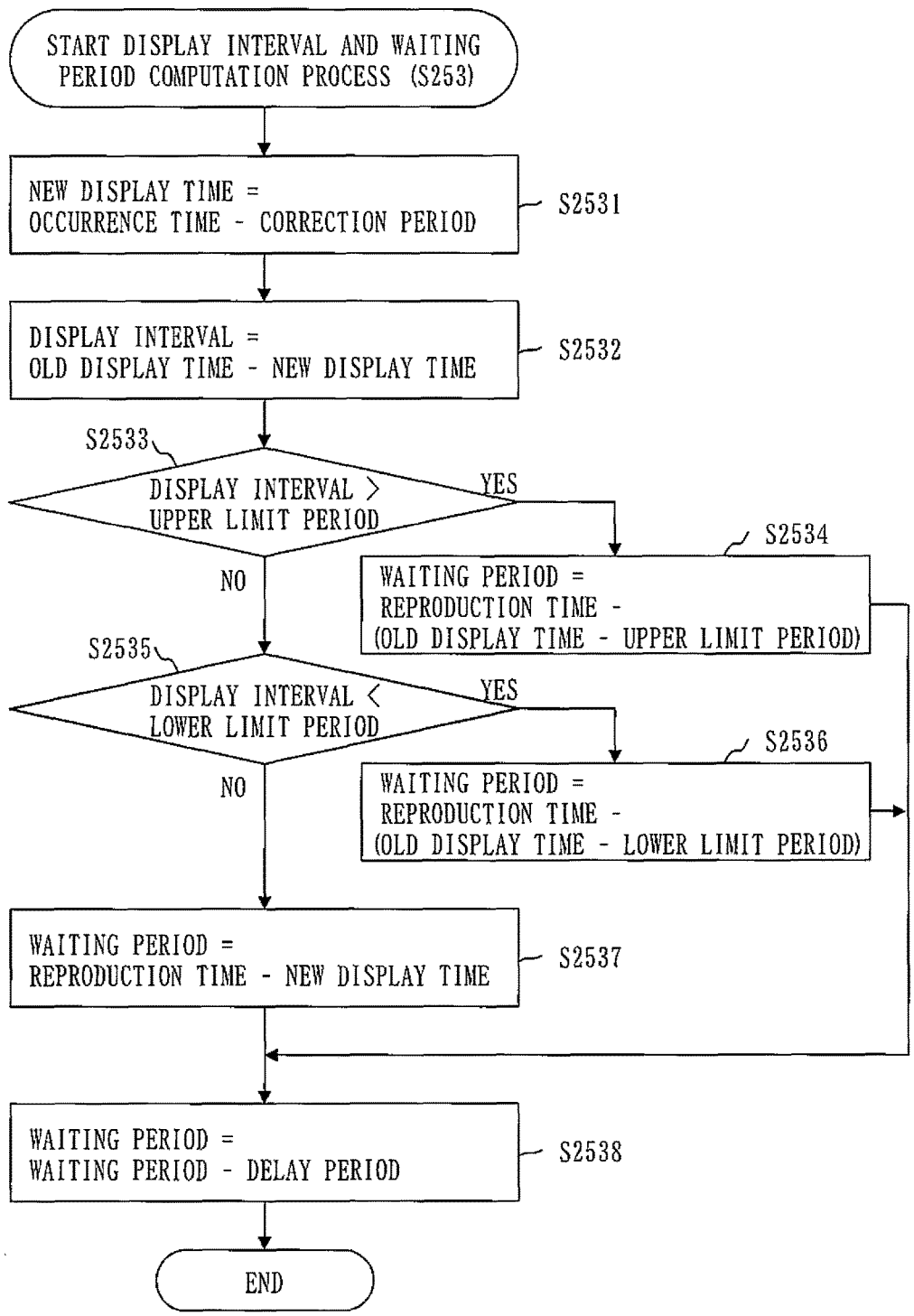
FIG. 23 is a flowchart of a display interval and waiting period computation process (S253) in the second embodiment.

Based on FIGS. 21 to 23, a description will be given about an embodiment in which a delay period occurred at a time of a change in a graphic display displaying a state of an object during simulation is taken into consideration when an operation of the object is reproduced. A description that overlaps with the description of the first embodiment, however, will be omitted.

*Description of Configuration*

A functional configuration of the simulation reproduction apparatus 100 is the same as that of the first embodiment except in the following respects.

Each piece of trace data 191D of a trace file 191 includes the delay period, as illustrated in FIG. 21.

The delay period is a period that has occurred at the time of the change in the graphic display displaying the state of the object during the simulation.

The waiting period computation unit 115 modifies a waiting period by subtracting the delay period included in new trace data from a computed waiting period.

The reproduction screen display unit 121 changes the state of the object when a waiting period after the modification has elapsed.

The reproduction clock unit 102 updates a reproduction time 109 to a new display time when the waiting period after the modification has elapsed.

*Description of Operations*

Operations of the simulation reproduction apparatus 100 are the same as the operations in the first embodiment except in the following respects.

Figure 8:
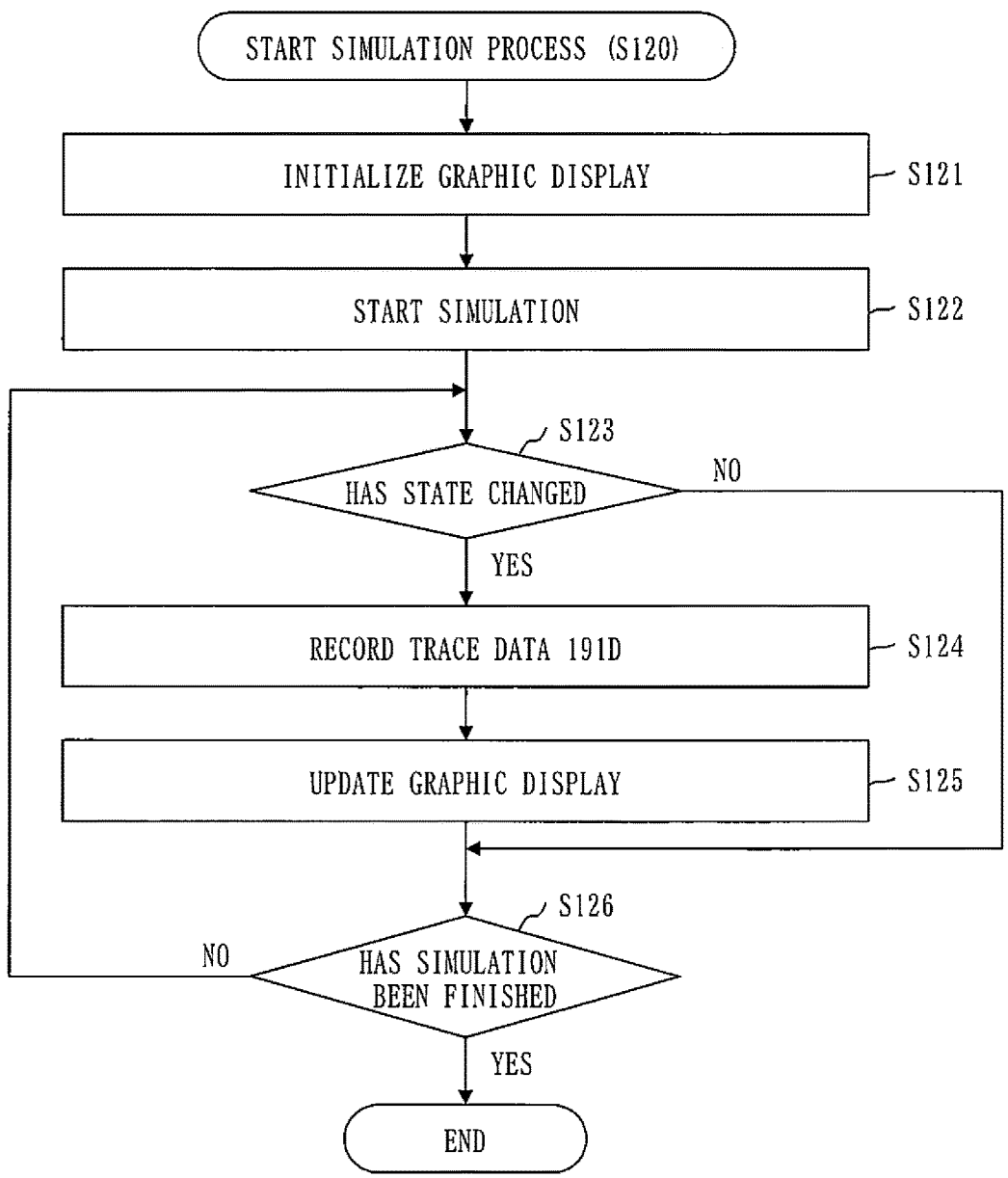
FIG. 8 is a flowchart of a simulation process (S120) in the first embodiment.

S125 in the simulation process (S120) described with reference to FIG. 8 is different from S125 in the first embodiment as follows.

In S125, the simulation unit 180 starts measurement of an update completion period when the simulation unit 180 instructs the simulation screen display unit 122 to update the graphic display.

Upon completion of the update of the graphic display, the simulation screen display unit 122 outputs an update completion notification. The update completion notification that has been output is input to the simulation unit 180.

When the update completion notification is input, the simulation unit 180 finishes the measurement of the update completion period.

The update completion period is a period of time taken for the update of the graphic display, and can be expressed by the following equation. An update instruction time is a time at which the simulation unit 180 has instructed the simulation screen display unit 122 to update the graphic display. The update completion time is a time at which the update completion notification has been input to the simulation unit 180.

update completion period=update completion time−
update instruction time

Then, the simulation unit 180 computes a period obtained by subtracting a prescribed period from the update completion period as the delay period and sets, in the trace data 191D that has been recorded, the computed delay period.

The delay period can be expressed by the following equation:

delay period=update completion period−prescribed
period

The prescribed period is a period of time set in advance. An example of the prescribed time is a transmission period of the update completion notification or a period obtained by adding a response period of the object to the transmission period of the update completion notification.

The transmission period of the update completion notification is a period of time from output of the update completion notification from the simulation screen display unit 122 to input of the output update completion notification to the simulation unit 180. When the object is an LED, the response period of the object is 50 to 100 nanoseconds.

A display interval and waiting period computation process (S243) will be described, based on FIG. 22.

The display interval and waiting period computation process (S243) includes S2438, in addition to S2431 to S2437 described in the first embodiment.

In S2438, the waiting period computation unit 115 acquires the delay period from the trace data 191D that has been read.

Then, the waiting period computation unit 115 modifies the waiting period by subtracting the acquired delay period from the computed waiting period.

A waiting period after the modification can be expressed by the following equation:

waiting period after modification=waiting period before modification−delay period Then, the period waiting unit 116 waits for elapse of the waiting period after the modification in S244 of the forward direction reproduction process (S240) described with reference to FIG. 14.

A display interval and waiting period computation process (S253) will be described, based on FIG. 23.

The display interval and waiting period computation process (S253) includes S2538, in addition to S2531 to S2537 described in the first embodiment.

In S2538, the waiting period computation unit 115 acquires the delay period from the trace data 191D that has been read.

Then, the waiting period computation unit 115 modifies the waiting period by subtracting the acquired delay period from the computed waiting period.

A waiting period after the modification can be expressed by the following equation:

waiting period after modification=waiting period before modification−delay period Then, the period waiting unit 116 waits for elapse of the waiting period after the modification in S254 of the reverse direction reproduction process (S250) described with reference to FIG. 16.

\*\*\*Description of Effect\*\*\*

When a change in a state of an object is reproduced by a graphic display, the change in the state of the object displayed by the graphic display may be delayed from the actual change in the state of the object.

Then, the simulation reproduction apparatus 100 modifies a waiting period by subtracting a delay period from the waiting period. This allows reproduction of the change in the state of the object by a graphic display which resembles the object of the actual apparatus more closely.

Each embodiment is an illustration of a preferred embodiment, and does not intend to limit the technical range of the present invention. Each embodiment may be partially carried out, or may be carried out by combination with a different embodiment.

The processing procedure described using the flowcharts and so on is an example of each of the simulation reproduction method and the processing procedure of the simulation reproduction program.

The trace file 191 may be one of an ordinary file to be stored in a hard disk and a memory mapped file to be read into a memory.

By replacing the file reference pointer with a memory address, the trace file 191 may be handled in an ordinary memory space.

When simulation is performed, the simulation unit 180 may set one of the occurrence time and the number of cycles in trace data 191D. The simulation reproduction apparatus 100 may include a mechanism to change the occurrence time (or the number of cycles) set in the trace data 191D to the number of cycles (or the occurrence time). The mechanism may perform conversion taking advantage of a speed ratio, as in Patent Document 1. Then, the conversion may be performed when the trace data 191D is read.

The period waiting unit 116 may detect elapse of a waiting period using a one shot timer, or may detect the elapse of the waiting period by polling a reproduction time 109.

The simulation unit 180 may perform simulation using one of a first method and a second method, as in common microcomputer simulation. The first method is the one in which an instruction of the simulation program is converted to an instruction for a virtual microcomputer, and an instruction after the conversion is executed by the virtual microcomputer. The second method is the one in which the instruction of the simulation program is converted to an instruction of a host processor, and an instruction after the conversion is executed by the host processor.

The simulation reproduction apparatus 100 is implemented by execution of the simulation program and the simulation reproduction program by a server, a work station, a personal computer, or other computer on which an operating system is running.

Figure 24:
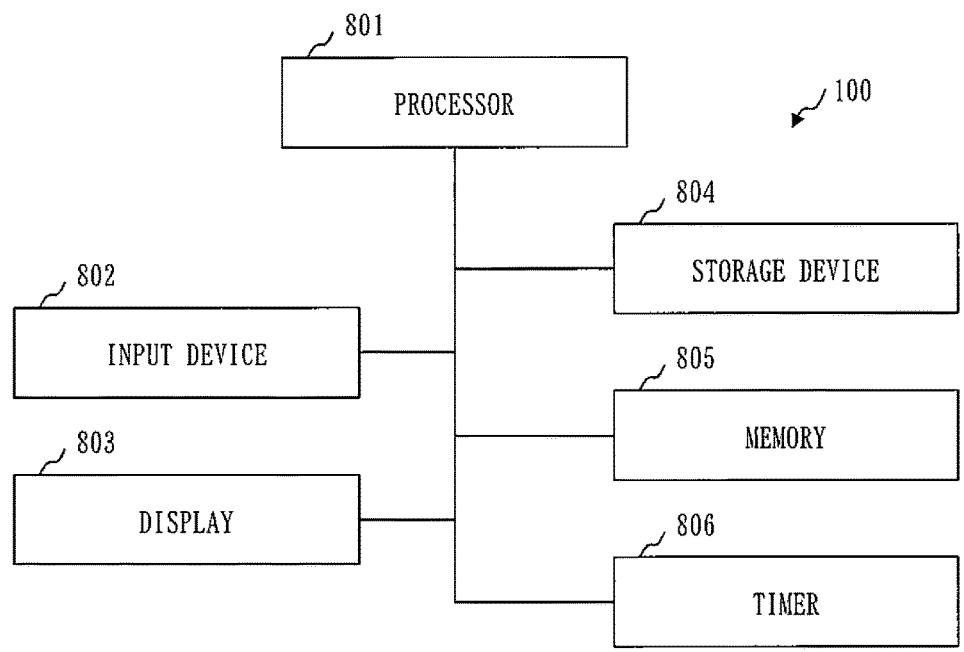
FIG. 24 is a hardware configuration diagram of the simulation reproduction apparatus 100 in each embodiment.

A hardware configuration of the simulation reproduction apparatus 100 will be described, based on FIG. 24.

The simulation reproduction apparatus 100 includes a processor 801, an input device 802, a display 803, a storage device 804, a memory 805, and a timer 806.

The simulation program and the simulation reproduction program are stored in the memory 805 and are executed by the processor 801.

Data to be used, to be generated, or to be input/output by the simulation reproduction apparatus 100 is stored in the memory 805 or the storage device 804. An example of the storage device 804 is a hard disk or a nonvolatile memory.

The user instruction is input to the simulation reproduction apparatus 100 using the input device 802 such as a keyboard, a mouse, a pointing device, or a touch panel.

An operation screen, the simulation screen, and the reproduction screen 200 of the simulation reproduction apparatus 100 are displayed on the display 803.

The reception unit 101 is implemented by the processor 801, the input device 802, and the display 803.

The reproduction clock unit 102 is implemented by the processor 801, the memory 805, and the timer 806.

The reproduction unit 110 and the simulation unit 180 are implemented by the processor 801, the memory 805, and the timer 806.

The display unit 120 is implemented by the processor 801, the memory 805, and the display 803.

The storage unit 190 is implemented by the memory 805 and the storage device 804.

REFERENCE SIGNS LIST

100: simulation reproduction apparatus, 101: reception unit, 102: reproduction clock unit, 109: reproduction time, 110: reproduction unit, 111: initialization unit, 112: inoperable direction determination unit, 113: trace data reading unit, 114: display interval computation unit, 115: waiting period computation unit, 116: period waiting unit, 117: period setting unit, 119: reproduction control unit, 120: display unit, 121: reproduction screen display unit, 122: simulation screen display unit, 130: timing control unit, 180: simulation unit, 189: simulation screen file, 190: storage unit, 191: trace file, 191D: trace data, 192: upper limit period, 193: lower limit period, 194: initial state flag, 195: inoperability information, 199: reproduction screen file, 200: reproduction screen, 210: graphic display, 220: button widget, 221: forward direction reproduction button, 222: reverse direction reproduction button, 223: forward direction frame feed button, 224: reverse direction frame feed button, 225: upper limit period button, 226: lower limit period button, 230: message region, 801: processor, 802: input device, 803: display, 804: storage device, 805: memory, 806: timer

The invention claimed is:

1. A simulation reproduction apparatus to debug software in an embedded system by simulating an operation of a hardware object in the embedded system responsive to execution of instructions of the software, the simulation reproduction apparatus comprising:
 a graphic display on which the simulated operations of the hardware object are reproduced; and
 processing circuitry to:
  store a trace file obtained by simulating the operation of the object and having one or more pieces of trace data recorded therein, each piece of the trace data including an occurrence time at which a change in a state of the object has occurred and a new state value indicating a state after the state has changed;
  receive a forward direction reproduction instruction to cause the operation of the object to be reproduced in an order of times, a temporary stop instruction to cause the operation of the object to be temporarily stopped, and a reverse direction frame feed instruction to cause the state of the object to be changed once in a reverse order of the times;
  read, from the trace file, each piece of the trace data in an order of the occurrence time when the forward direction reproduction instruction is received, and to read one piece of the trace data from the trace file in a reverse order of the occurrence time when the reverse direction frame feed instruction is received;
  determine a timing for updating the graphic display based on a new display time corresponding to the occurrence time included in new trace data being the trace data read at a time and an old display time corresponding to the occurrence time included in old trace data being the trace data read at a previous time; and
  change the state of the object displayed by the graphic display to the state indicated by the new state value included in the new trace data, at the determined timing, wherein the displaying is performed to reproduce the simulated operations of the hardware object to allow a user to identify a state of the hardware object when a wrong operation occurs while debugging the software.

2. The simulation reproduction apparatus according to claim 1,
 wherein the processing circuitry receives a forward direction frame feed instruction to cause the state of the object to be changed once in the order of the times; and
 wherein when the forward direction frame feed instruction is received, the processing circuitry reads one piece of the trace data from the trace file in the order of the occurrence time.

3. The simulation reproduction apparatus according to claim 1,
 wherein the processing circuitry receives a reverse direction reproduction instruction to cause the operation of the object to be reproduced in the reverse order of the times; and
 wherein when the reverse direction reproduction instruction is received, the processing circuitry reads, from the trace file, each piece of the trace data in the reverse order of the occurrence time.

4. The simulation reproduction apparatus according to claim 1,
 wherein when an interval between the new display time and the old display time is shorter than a lower limit period, the timing is a time shifted from the old display time by the lower limit period.

5. The simulation reproduction apparatus according to claim 1,
 wherein when an interval between the new display time and the old display time is longer than an upper limit period, the timing is a time shifted from the old display time by the upper limit period.

6. The simulation reproduction apparatus according to claim 1,
 wherein each piece of the trace data includes a delay period that has occurred at a time of a change in the graphic display displaying the state of the object during the simulation; and
 wherein the processing circuitry determines the timing, based on the new display time, the old display time, and the delay period.

7. The simulation reproduction apparatus according to claim 1,
 wherein the graphic display includes a reproduction time being a time at which a time in a time zone where the operation of the object has been simulated is reproduced; and
 wherein when the reverse direction frame feed instruction is received, the processing circuitry updates the reproduction time to a time traced back from the occurrence time included in the new trace data by a correction period.

8. The simulation reproduction apparatus according to claim 7,
 wherein the processing circuitry receives a reverse direction reproduction instruction to cause the operation of the object to be reproduced in the reverse order of the times; and
 wherein when the reverse direction reproduction instruction is received, the processing circuitry updates the reproduction time to a time traced back from the occurrence time included in the new trace data by the correction period.

9. The simulation reproduction apparatus according to claim 1,
 wherein the processing circuitry functions as a clock indicating a reproduction time being a time at which a time in a time zone where the operation of the object has been simulated is reproduced;
 wherein when the forward direction reproduction instruction is received, the processing circuitry causes the reproduction time to proceed in the order of the times; and
 wherein the processing circuitry determines the timing based on the new display time, the old display time, and the reproduction time.

10. The simulation reproduction apparatus according to claim 9,
 wherein the processing circuitry receives a reverse direction reproduction instruction to cause the operation of the object to be reproduced in the reverse order of the times; and
 wherein when the reverse direction reproduction instruction is received, the processing circuitry causes the reproduction time to proceed in the reverse order of the times.

11. The simulation reproduction apparatus according to claim 9, wherein the processing circuitry receives a forward direction frame feed instruction to cause the state of the object to be changed once in the order of the times; and wherein when the forward direction frame feed instruction or the reverse direction frame feed instruction is received, the processing circuitry updates the reproduction time to the new display time.

12. The simulation reproduction apparatus according to claim 1, wherein the processing circuitry functions as a clock indicating a reproduction time being a time at which a time in a time zone where the operation of the object has been simulated is reproduced;

computes a display interval being an interval between the new display time and the old display time; and computes a waiting period until the state of the object is changed;

wherein when the forward direction reproduction instruction is received, the processing circuitry causes the reproduction time to proceed in the order of the times;

wherein when the forward direction reproduction instruction is received, the processing circuitry computes an interval from the old display time to the new display time being the occurrence time included in the new trace data as the display interval;

wherein when the display interval computed is longer than an upper limit period, the processing circuitry computes an interval between the reproduction time indicated and a time at which the upper limit period elapses from the old display time, as the waiting period;

wherein the processing circuitry changes the state of the object, using a time at which the computed waiting period has elapsed, as the timing; and wherein when the computed waiting period has elapsed, the processing circuitry updates the reproduction time to the new display time.

13. The simulation reproduction apparatus according to claim 12, wherein each piece of the trace data includes an old state value indicating a state before the change in the state;

wherein the processing circuitry receives a reverse direction reproduction instruction to cause the operation of the object to reproduce in the reverse order of the times;

wherein when the reverse direction reproduction instruction is received, the processing circuitry causes the reproduction time to proceed in the reverse order of the times;

wherein when the reverse direction reproduction instruction is received, the processing circuitry reads each piece of the trace data in the reverse order of the occurrence time;

wherein when the reverse direction reproduction instruction is received, the processing circuitry computes the interval from the new display time to the old display time as the display interval, the new display time being a time traced back from the occurrence time included in the new trace data by a correction period;

wherein when the computed display interval is longer than the upper limit period, the processing circuitry computes an interval between the reproduction time indicated and a time traced back from the old display time by the upper limit period, as the waiting period;

wherein when the computed waiting period elapses, the processing circuitry changes the state of the object to the state indicated by the new state value included in the new trace data; and wherein when the computed waiting period elapses, the processing circuitry updates the reproduction time to the new display time.

14. A simulation-reproduction method of debugging software in an embedded system by simulating an operation of a hardware object in the embedded system responsive to execution of instructions of the software, the simulation reproduction method comprising:

storing a trace file obtained by simulating the operation of the hardware object and having one or more pieces of trace data recorded therein, each piece of the trace data including an occurrence time at which a change in a state of the object has occurred and a new state value indicating a state after the state has changed;

receiving a forward direction reproduction instruction to cause the operation of the object to be reproduced in an order of times, a temporary stop instruction to cause the operation of the hardware object to be temporarily stopped, and a reverse direction frame feed instruction to cause the state of the hardware object to be changed once in a reverse order of the times;

reading, from the trace file, each piece of the trace data in an order of the occurrence time when the forward direction reproduction instruction is received, and reading one piece of the trace data from the trace file in a reverse order of the occurrence time when the reverse direction frame feed instruction is received;

determining a timing for updating the graphic display based on a new display time corresponding to the occurrence time included in new trace data being the trace data read at a time and an old display time corresponding to the occurrence time included in old trace data being the trace data read last time; and changing the state of the object displayed by a graphic display to the state indicated by the new state value included in the new trace data, at the determined timing, causing the graphic display to reproduce simulated operations of the hardware object to allow a user to identify a state of the hardware object when a wrong operation occurs while debugging the software.

15. A non-transitory computer-readable medium storing a simulation reproduction program using a trace file obtained by simulating an operation of a hardware object in an embedded system responsive to execution of instructions of software in the embedded system, the trace file having one or more pieces of trace data recorded therein, each piece of the trace data including an occurrence time at which a change in a state of the hardware object has occurred and a new state value indicating a state after the state has changed, the simulation reproduction program when executed by a computer to perform:

a reception process of receiving a forward direction reproduction instruction to cause the operation of the hardware object to be reproduced in an order of times, a temporary stop instruction to cause the operation of the hardware object to be temporarily stopped, and a reverse direction frame feed instruction to cause the state of the object to be changed once in a reverse order of the times;

a trace data reading process of reading, from the trace file, each piece of the trace data in an order of the occurrence time when the forward direction reproduction instruction is received, and reading one piece of the trace data from the trace file in a reverse order of the occurrence time when the reverse direction frame feed instruction is received;

a timing control process of determining a timing for updating the graphic display based on a new display time corresponding to the occurrence time included in new trace data being the trace data read at a time and an old display time corresponding to the occurrence time included in old trace data being the trace data read last time; and a display process of changing the state of the hardware object displayed by the graphic display to the state indicated by the new state value included in the new trace data, wherein the display process is performed to reproduce simulated operations of the hardware object to allow a user to identify a state of the hardware object when a wrong operation occurs while debugging the software.

* * * * *